(12) United States Patent
Nonomura

(10) Patent No.: US 9,326,385 B2
(45) Date of Patent: Apr. 26, 2016

(54) LED PACKAGE MANUFACTURING SYSTEM AND RESIN COATING METHOD IN LED PACKAGE MANUFACTURING SYSTEM

(75) Inventor: Masaru Nonomura, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 254 days.

(21) Appl. No.: 13/877,746

(22) PCT Filed: May 11, 2011

(86) PCT No.: PCT/JP2011/002616
§ 371 (c)(1),
(2), (4) Date: Apr. 4, 2013

(87) PCT Pub. No.: WO2012/056605
PCT Pub. Date: May 3, 2012

(65) Prior Publication Data
US 2013/0192061 A1    Aug. 1, 2013

(30) Foreign Application Priority Data

Oct. 27, 2010    (JP) .................................. 2010-240468

(51) Int. Cl.
*H05K 3/32*    (2006.01)
*H05K 3/30*    (2006.01)
(Continued)

(52) U.S. Cl.
CPC ............ *H05K 3/301* (2013.01); *H01L 33/0095* (2013.01); *H01L 33/507* (2013.01);
(Continued)

(58) Field of Classification Search
CPC ................................................ Y10T 29/49146

USPC ........... 29/739–741, 855, 856, 857, 841, 832; 438/124, 125, 126, 127
See application file for complete search history.

(56) References Cited

U.S. PATENT DOCUMENTS 7,897,419 B2* 3/2011 Donofrio .............. H01L 33/005
257/88
8,193,544 B2* 6/2012 Donofrio .............. H01L 33/005
257/88

(Continued)

FOREIGN PATENT DOCUMENTS

JP    2005-508093 A    3/2005
JP    2007-066969 A    3/2007

(Continued)

OTHER PUBLICATIONS

International Search Report for PCT/JP2011/002616 dated Aug. 16, 2011.

*Primary Examiner* — Peter Dungba Vo
*Assistant Examiner* — Kaying Kue
(74) *Attorney, Agent, or Firm* — Pearne & Gordon LLP

(57) ABSTRACT

In resin coating used for manufacturing the LED package in which the LED elements is covered with a resin containing a phosphor, a translucent member 43 coated with a resin 8 on trial as light emitting characteristic measurement is mounted on a translucent member mounting unit 41 having a light source unit, and an excitation light emitted from the light source unit is irradiated onto the resin 8 coated on the translucent member 43, and a deviation between a measurement result obtained by measuring the light emitting characteristics of a light emitted by the resin 8 by a light emitting characteristic measurement unit 39 and light emitting characteristics specified in advance is obtained, and an appropriate resin coating amount of the resin to be coated on the LED elements as real production is calculated on the basis of the deviation.

6 Claims, 17 Drawing Sheets

(51) Int. Cl.
  *H01L 33/00* (2010.01)
  *H01L 33/50* (2010.01)
(52) U.S. Cl.
  CPC ............. *H01L2224/48091* (2013.01); *H01L 2224/49107* (2013.01); *H01L 2933/0041* (2013.01); *Y10T 29/53174* (2015.01)

(56) References Cited

U.S. PATENT DOCUMENTS

| | | | | |
|---|---|---|---|---|
| 8,288,777 B2 * | 10/2012 | Peng | ............... | H01L 24/29 257/100 |
| 8,871,538 B2 * | 10/2014 | Kim | ............... | H01L 33/50 438/29 |
| 8,877,524 B2 * | 11/2014 | Chitnis | ............... | H01L 33/0095 438/14 |
| 9,017,822 B2 * | 4/2015 | Fukunaga | ............... | B29C 39/10 257/788 |
| 9,040,314 B2 * | 5/2015 | Abe | ............... | H01L 22/24 118/697 |
| 9,048,177 B2 * | 6/2015 | Abe | ............... | H01L 24/27 |
| 2003/0089918 A1 | 5/2003 | Hiller et al. | | |
| 2010/0129525 A1 | 5/2010 | Shida et al. | | |
| 2010/0207521 A1 | 8/2010 | Tamaki et al. | | |
| 2010/0230696 A1 * | 9/2010 | Fukunaga | ............... | H01L 23/49586 257/98 |
| 2011/0070668 A1 | 3/2011 | Hiller et al. | | |
| 2011/0070669 A1 | 3/2011 | Hiller et al. | | |

FOREIGN PATENT DOCUMENTS

| | | |
|---|---|---|
| JP | 2008-541412 A | 11/2008 |
| JP | 2010-186968 A | 8/2010 |
| WO | 2009/045924 A1 | 4/2009 |
| WO | 2009/123726 A2 | 10/2009 |

\* cited by examiner

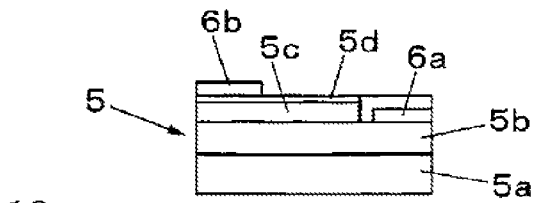
FIG. 3A
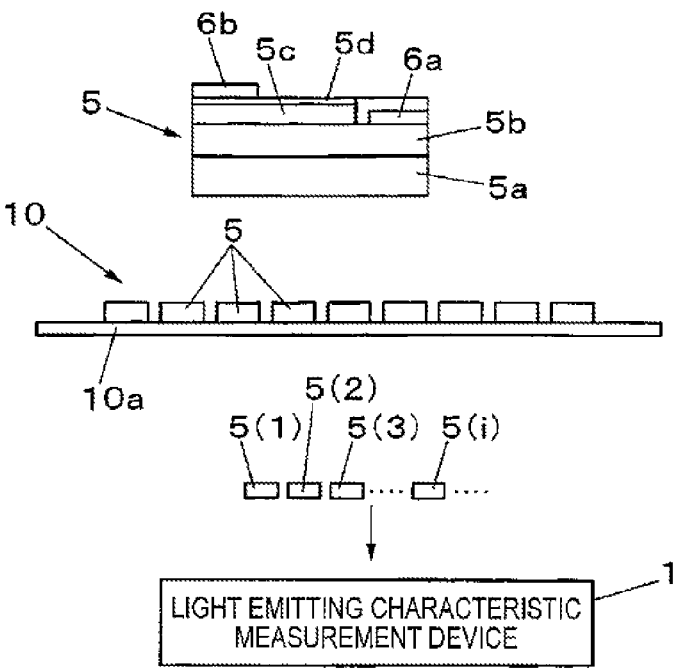
FIG. 3B
FIG. 3C
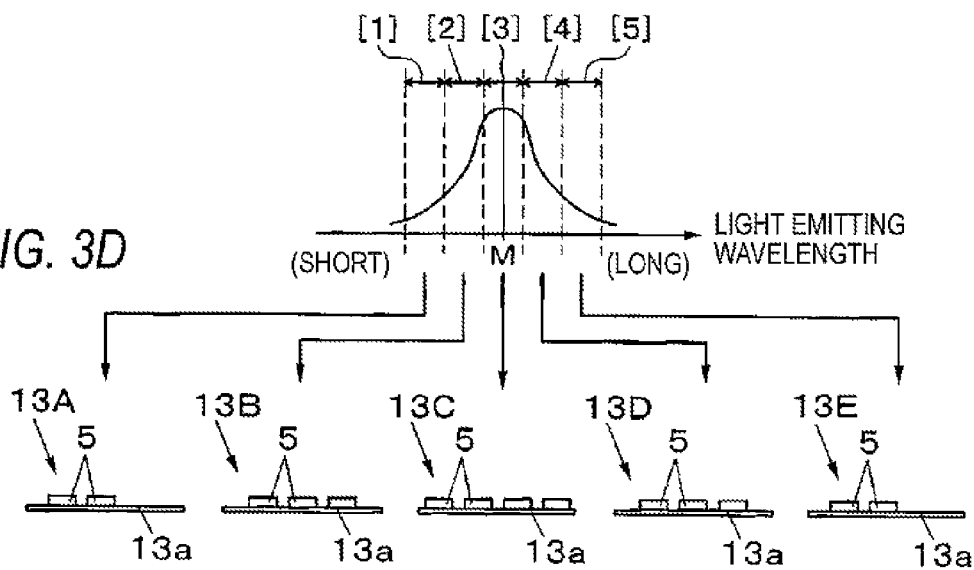
FIG. 3D

FIG. 4

| | BIN CODE CATEGORICAL APPROPRIATE RESIN COATING AMOUNT SHORT <<< (WAVELENGTH 465nm) >>> LONG | | | | |
|---|---|---|---|---|---|
| PHOSPHOR CONCENTRATION (%) | [1] | [2] | [3] | [4] | [5] |
| D1 (5%) | VAO | VBO | VCO | VDO | VEO |
| D2 (10%) | VFO | VGO | VHO | VJO | VKO |
| D3 (15%) | VLO | VMO | VNO | VPO | VRO |

| BIN CODE | SHORT <<< (WAVELENGTH 465nm) >>> LONG | | | | |
|---|---|---|---|---|---|
| | [1] | [2] | [3] | [4] | [5] |
| APPROPRIATE RESIN COATING AMOUNT (PURE 5% RESIN) | VA0 | VB0 | VC0 | VD0 | VE0 |
| LIGHT EMITTING CHARACTERISTICS MEASUREMENT VALUE CHRONICITY COORDINATE Z | ZA0 (XA0, YA0) | ZB0 (XB0, YB0) | ZC0 (XC0, YC0) | ZD0 (XD0, YD0) | ZE0 (XE0, YE0) |
| THRESHOLD DATA | ZA0 ±10% | ZB0 ±10% | ZC0 ±10% | ZD0 ±10% | ZE0 ±10% |

12b → BIN CODE row
15(1) → APPROPRIATE RESIN COATING AMOUNT row
39a(1) → LIGHT EMITTING CHARACTERISTICS row
81a(1) → THRESHOLD DATA row

FIG. 12B

| BIN CODE | SHORT <<< (WAVELENGTH 465nm) >>> LONG | | | | |
|---|---|---|---|---|---|
| | [1] | [2] | [3] | [4] | [5] |
| APPROPRIATE RESIN COATING AMOUNT (PURE 10% RESIN) | VF0 | VG0 | VH0 | VJ0 | VK0 |
| LIGHT EMITTING CHARACTERISTICS MEASUREMENT VALUE CHRONICITY COORDINATE Z | ZF0 (XF0, YF0) | ZG0 (XG0, YG0) | ZH0 (XH0, YH0) | ZJ0 (XJ0, YJ0) | ZK0 (XK0, YK0) |
| THRESHOLD DATA | ZF0 ±10% | ZG0 ±10% | ZH0 ±10% | ZJ0 ±10% | ZK0 ±10% |

| BIN CODE | SHORT <<< (WAVELENGTH 465nm) >>> LONG | | | | |
|---|---|---|---|---|---|
| | [1] | [2] | [3] | [4] | [5] |
| APPROPRIATE RESIN COATING AMOUNT (PURE 15% RESIN) | VL0 | VM0 | VN0 | VP0 | VR0 |
| LIGHT EMITTING CHARACTERISTICS MEASUREMENT VALUE CHRONICITY COORDINATE Z | ZL0 (XL0, YL0) | ZM0 (XM0, YM0) | ZN0 (XN0, YN0) | ZP0 (XP0, YP0) | ZR0 (XR0, YR0) |
| THRESHOLD DATA | ZL0 ±10% | ZM0 ±10% | ZN0 ±10% | ZP0 ±10% | ZR0 ±10% |

TRIAL COATING

| | SHORT <<< (WAVELENGTH 465nm) >>> LONG | | | | |
|---|---|---|---|---|---|
| BIN CODE | [1] | [2] | [3] | [4] | [5] |
| REAL RESIN COATING AMOUNT | VA1 | VB1 | VC1 | VD1 | VE1 |

FIG. 15B

LIGHT EMITTING CHARACTERISTIC MEASUREMENT

| LIGHT EMITTING CHARACTERISTIC MEASUREMENT VALUE CHRONICITY COORDINATE Z | ZA1 ($X_{A1}$, $Y_{A1}$) | ZB1 ($X_{B1}$, $Y_{B1}$) | ZC1 ($X_{C1}$, $Y_{C1}$) | ZD1 ($X_{D1}$, $Y_{D1}$) | ZE1 ($X_{E1}$, $Y_{E1}$) |
|---|---|---|---|---|---|
| DEVIATION | $\Delta X_A \; \Delta Y_A$ | $\Delta X_B \; \Delta Y_B$ | $\Delta X_C \; \Delta Y_C$ | $\Delta X_D \; \Delta Y_D$ | $\Delta X_E \; \Delta Y_E$ |

FIG. 15C

COMPARISON OF DEVIATION WITH THRESHOLD VALUE

| DEVIATION | $\Delta X_A \; \Delta Y_A$ | $\Delta X_B \; \Delta Y_B$ | $\Delta X_C \; \Delta Y_C$ | $\Delta X_D \; \Delta Y_D$ | $\Delta X_E \; \Delta Y_E$ |
|---|---|---|---|---|---|
| THRESHOLD DATA | ZA0 ±10% | ZB0 ±10% | ZC0 ±10% | ZD0 ±10% | ZE0 ±10% |

DEVIATION ≤ THRESHOLD VALUE
EXECUTE PRODUCTION COATING OPERATION BY PRESET APPROPTIATE RESIN COATING AMOUNT
DEVIATION > THRESHOLD VALUE

FIG. 15D

DERIVE NEW APPROPRIATE RESIN COATING AMOUNT

| | SHORT <<< (WAVELENGTH 465nm) >>> LONG | | | | |
|---|---|---|---|---|---|
| BIN CODE | [1] | [2] | [3] | [4] | [5] |
| CORRECTED APPROPRIATE RESIN COATING AMOUNT | VA2 | VB2 | VC2 | VD2 | VE2 |

*UPDATED VALUE ADDED WITH CORRECTION CORRESPONDING TO EACH DEVIATION

LED PACKAGE MANUFACTURING SYSTEM AND RESIN COATING METHOD IN LED PACKAGE MANUFACTURING SYSTEM

TECHNICAL FIELD

The present invention relates to an LED package manufacturing system that manufactures an LED package in which an LED element mounted on a substrate is coated with a resin containing a phosphor, and a resin coating method in the LED package manufacturing system.

BACKGROUND ART

In recent years, LEDs (light emitting diodes) having excellent characteristics that a power consumption is low, and a lifetime is long have been used as light sources of various lighting devices extensively. Because fundamental lights emitted by the LED elements are limited to three lights of red, green, and blue as of now, in order to obtain a suitable while light as a general lighting intended purpose, there are used a method of obtaining the while light by additively mixing the above-mentioned three fundamental lights together, and a method of obtaining an artificial white light by combination of a blue LED with the phosphor that emits a yellow fluorescence having a complementary relationship with the blue. In recent years, the latter method has been used extensively, and the lighting device using the LED package combining the blue LED with a YAG phosphor is used for backlight of a liquid crystal panel (for example, refer to Patent Literature 1).

In the patent literature example, the LED package is configured in such a manner that after the LED elements have been mounted on a bottom surface of a recessed mounting portion having a reflection surface formed on a side wall, a silicone resin or an epoxy resin having YAG phosphor grains dispersed therein is poured into the mounting portion where the YAG phosphor grains are dispersed within the mounting portion to form a resin packaged portion. Also, the patent literature discloses an example in which for the purpose of achieving an even height of the resin packaged portion within the mounting portion into which the resin has been poured, an excess resin storage portion into which a poured excess resin of a defined amount or more is discharged from the mounting portion and stored is formed. With this configuration, even if the amount of discharge from a dispenser is dispersed at the time of pouring the resin, the resin packaged portion having a given amount of resin and a defined height is formed on each of the LED elements.

CITATION LIST

Patent Literature

Patent Literature 1: JP-A-2007-66969

SUMMARY OF INVENTION

Technical Problem

However, the above-mentioned prior art example suffers from such a problem that the light emitting characteristics of the LED package as a product are varied by a variation of the light emitting wavelength in the individual LED elements. That is, each of the LED elements is subject to a manufacturing process of forming a plurality of elements on a wafer in a lump. Due to a variety of error factors in the manufacturing process, for example, an uneven composition at the time of forming a film in the wafer, the LED elements divided from a wafer state into pieces cannot prevent the light emitting wavelength from being varied. In the above-mentioned example, since the even height of the resin packaged portion that covers the LED element is kept, the variation in the light emitting wavelength in the pieces of LED elements is reflected on a variation of the light emitting characteristics of the LED package as the product as it is. As a result, defectives departing from a quality allowable range are forced to increase. Thus, the conventional LED package manufacturing technique suffers from such a problem that the variation in the light emitting wavelength in the pieces of LED elements causes the variation in the light emitting characteristics of the LED package as the product, resulting in the deterioration of a production yield.

Under the circumstances, an object of the present invention is to provide an LED package manufacturing system and a resin coating method, which can achieve the even light emitting characteristics of the LED package to improve the production yield even if the light emitting wavelengths of the pieces of LED elements are varied in the LED package manufacturing system.

Solution to Problem

According to the present invention, there is provided an LED package manufacturing system that manufactures an LED package in which an LED element mounted on a substrate is covered with a resin containing a phosphor therein, the LED package manufacturing system including: a component mounting device that mounts a plurality of LED elements on the substrate; element characteristic information providing unit for providing information obtained by measuring light emitting characteristics of the plurality of LED elements including a light emitting wavelength in advance, individually, as element characteristic information; resin information providing unit for providing information associating an appropriate resin coating amount of the resin for obtaining the LED package having specified light emitting characteristics with the element characteristic information, as resin coating information; map data creating unit for creating map data associating mounting position information indicative of positions of the LED elements mounted by the component mounting device on the substrate with the element characteristic information on the LED elements for each substrate; and a resin coating device that coats the resin of the appropriate resin coating amount for providing specific light emitting characteristics on the respective LED elements mounted on the substrate, on the basis of the map data and the resin coating information. The resin coating device includes: a resin coating unit that discharges the resin of a variable coating amount to coat the resin at an arbitrary position to be coated; a coating control unit that controls the resin coating unit to execute measurement coating processing of coating the resin on a translucent member on trial as light emitting characteristic measurement, and to execute production coating processing of coating the resin on the LED elements as real production; a translucent member mounting unit having a light source unit that emits an excitation light for exciting the phosphor, on which the translucent member coated with the resin on trial in the measurement coating processing is mounted; a light emitting characteristic measurement unit that irradiates the resin coated on the translucent member with the excitation light emitted from the light source unit to measure the light emitting characteristics of the light emitted by the resin; a coating amount derivation processing unit that obtains a deviation between a measurement result of the light emitting characteristic measurement unit and the light emitting characteristics specified in advance, and corrects the appropriate resin coating amount on the basis of the deviation to derive an appropriate resin coating amount for the real production to be coated on the LED elements; and a production execution processing unit that instructs the coating control unit on the derived appropriate resin coating amount to execute the production coating processing of coating the resin of the appropriate resin coating amount on the LED elements.

According to the present invention, there is provided a resin coating method in an LED package manufacturing system that manufactures an LED package in which an LED element mounted on a substrate is covered with a resin containing a phosphor therein, in which the resin is coated on a plurality of LED elements mounted on the substrate by the component mounting device, the LED package manufacturing system including: a component mounting device that mounts the plurality of LED elements on the substrate; element characteristic information providing unit for providing information obtained by measuring light emitting characteristics of the plurality of LED elements including a light emitting wavelength in advance, individually, as element characteristic information; resin information providing unit for providing information associating an appropriate resin coating amount of the resin for obtaining the LED package having specified light emitting characteristics with the element characteristic information, as resin coating information; map data creating unit for creating map data associating mounting position information indicative of positions of the LED elements mounted by the component mounting device on the substrate with the element characteristic information on the LED elements for each substrate; and a resin coating device that coats the resin of the appropriate resin coating amount for providing regular light emitting characteristics required for a completed product on the respective LED elements mounted on the substrate, on the basis of the map data and the resin coating information, the resin coating method including: a measurement coating step of coating the resin on a translucent member as light emitting characteristic measurement on trial by a resin discharge unit that discharges the resin of a variable coating amount; a translucent member mounting step of mounting the translucent member coated with the resin on trial on a translucent member mounting unit having a light source unit which emits an excitation light for exciting the phosphor; a light emitting characteristic measuring step of irradiating the resin coated on the translucent member with the excitation light emitted from the light source unit to measure the light emitting characteristics of the light emitted by the resin; a coating amount derivation processing step of obtaining a deviation between a measurement result in the light emitting characteristic measurement step and the light emitting characteristic specified in advance, and correcting the appropriate resin coating amount on the basis of the deviation to derive an appropriate resin coating amount for real production to be coated on the LED elements; and a production executing step of instructing a coating control unit that controls the resin discharge unit on the derived appropriate resin coating amount to execute the production coating processing of coating the resin of the appropriate resin coating amount on the LED elements.

Advantageous Effects of Invention

According to the present invention, even if the light emitting wavelengths of the pieces of LED elements are varied, the even light emitting characteristics of the LED package can be achieved to improve the production yield.

BRIEF DESCRIPTION OF DRAWINGS

FIGS. 3A, 3B, 3C, and 3D are illustrative views illustrating a supply configuration and element characteristic information of LED elements used in the LED package manufacturing system according to the embodiment of the present invention.

FIG. 4 is an illustrative view of resin coating information used in the LED package manufacturing system according to the embodiment of the present invention.

FIGS. 12A, 12B, and 12C are illustrative views of the threshold data for the non-defective product determination in the LED package manufacturing system according to the embodiment of the present invention.

FIGS. 15A, 15B, 15C, and 15D are illustrative views of the resin coating operation processing in the LED package manufacturing process in the LED package manufacturing system according to the embodiment of the present invention.

FIGS. 17A, 17B, 170, and 17D are illustrative views illustrating steps of the LED package manufacturing process in the LED package manufacturing system according to the embodiment of the present invention.

DESCRIPTION OF EMBODIMENTS

Figure 1:
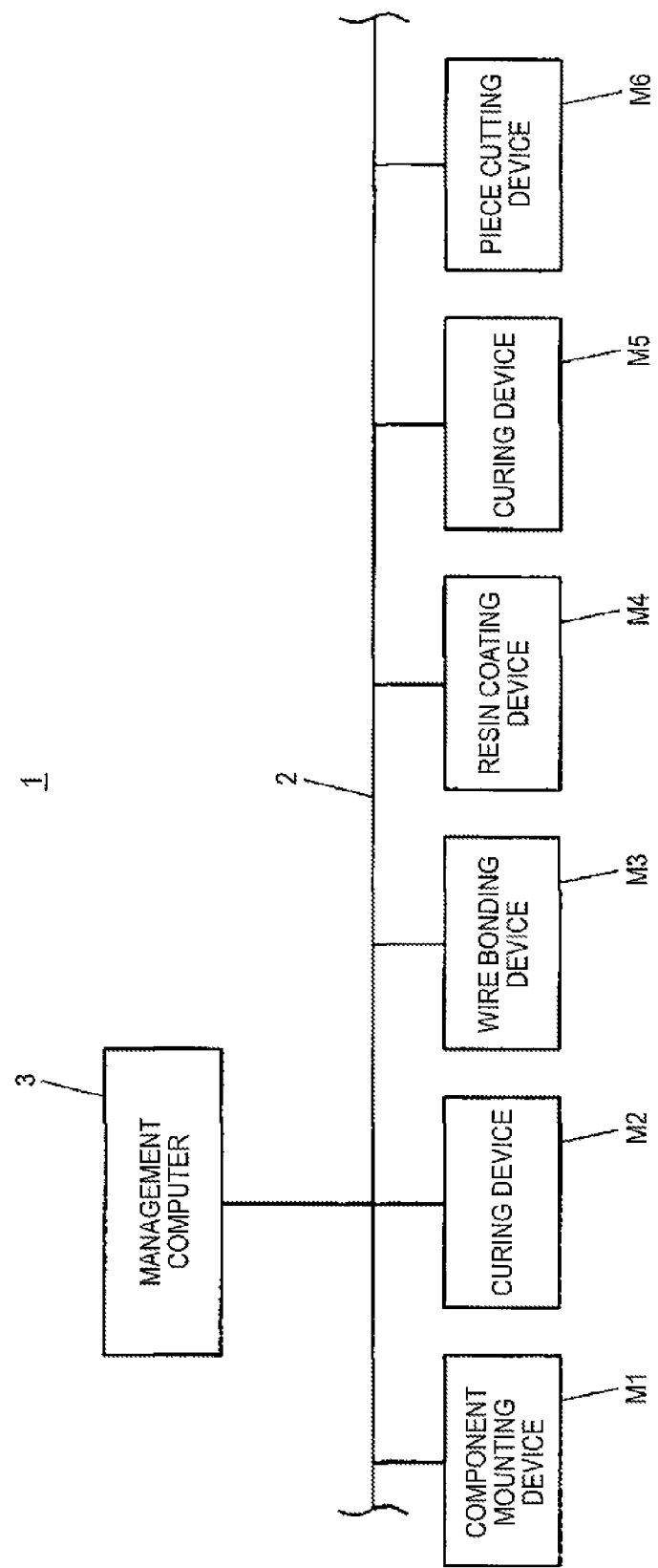
FIG. 1 is a block diagram illustrating a configuration of an LED package manufacturing system according to an embodiment of the present invention.

Subsequently, embodiments of the present invention will be described with reference to the drawings. First, a configuration of an LED package manufacturing system 1 will be described with reference to FIG. 1. The LED package manufacturing system 1 has a function of manufacturing an LED package in which each LED element mounted on a substrate is covered with a resin containing a phosphor therein. In this embodiment, as illustrated in FIG. 1, the respective devices of a component mounting device M1, a curing device M2, a wire bonding device M3, a resin coating device M4, a curing device M5, and a piece cutting device M6 are connected to each other by a LAN system 2, and a management computer 3 controls those respective devices in the lump.

The component mounting device M1 bonds each LED element 5 to a substrate 4 (refer to FIG. 2) which is a base of the LED package with a resin adhesive to mount the LED element 5 on the substrate 4. The curing device M2 heats the substrate 4 on which the LED element 5 has been mounted to cure the resin adhesive used for bonding at the time of mounting. The wire bonding device M3 connects electrodes of the substrate 4 to electrodes of the LED element 5 by bonding wire. The resin coating device M4 coats each of the LED elements 5 on the substrate 4 subjected to wiring bonding with the resin containing the phosphor. The curing device M5 heats the substrate 4 on which the resin has been coated, to thereby cure the resin coated over the LED element 5. The piece cutting device M6 cuts the substrate 4 on which the resin has been cured for each of the LED elements 5, and divides the substrate 4 into pieces of the LED packages. As a result, the LED packages divided into the pieces are completed.

FIG. 1 illustrates an example in which the respective devices of the component mounting device M1 to the piece cutting device M6 are arranged in series to configure a manufacturing line. However, the LED package manufacturing system 1 does not always need to employ the line configuration of this type. To the extent that information transmission to be described below is appropriately conducted, the respective process operation may be sequentially executed by the respective dispersed devices. Also, a plasma processing device that conducts plasma processing for the purpose of cleaning the electrodes prior to the wire bonding, and a plasma processing device that conducts plasma processing for the purpose of surface modification to improve the adhesion of the resin prior to the resin coating after the wire bonding may be disposed before and after the wire bonding device M3.

Figure 2A:
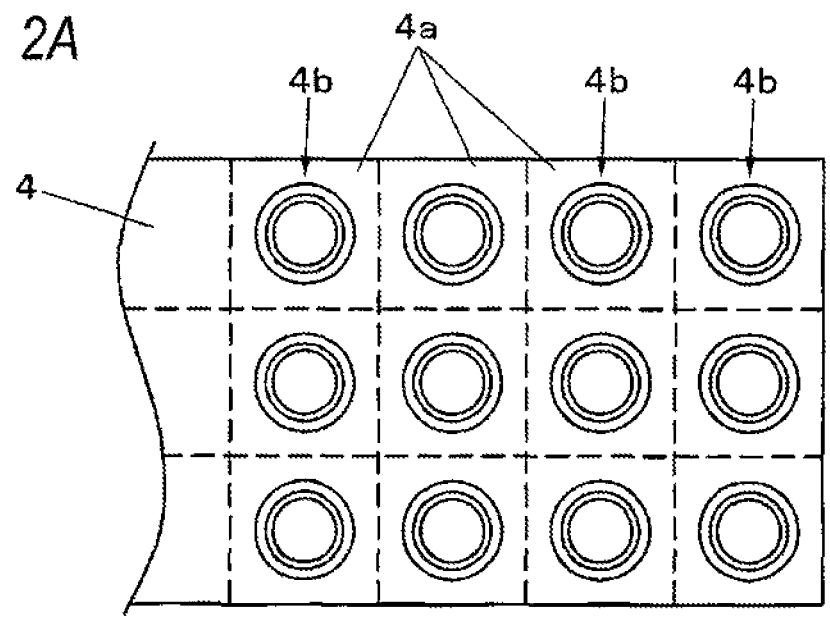
FIGS. 2A and 2B are illustrative views of a configuration of an LED package manufactured by the LED package manufacturing system according to the embodiment of the present invention.
Figure 2B:
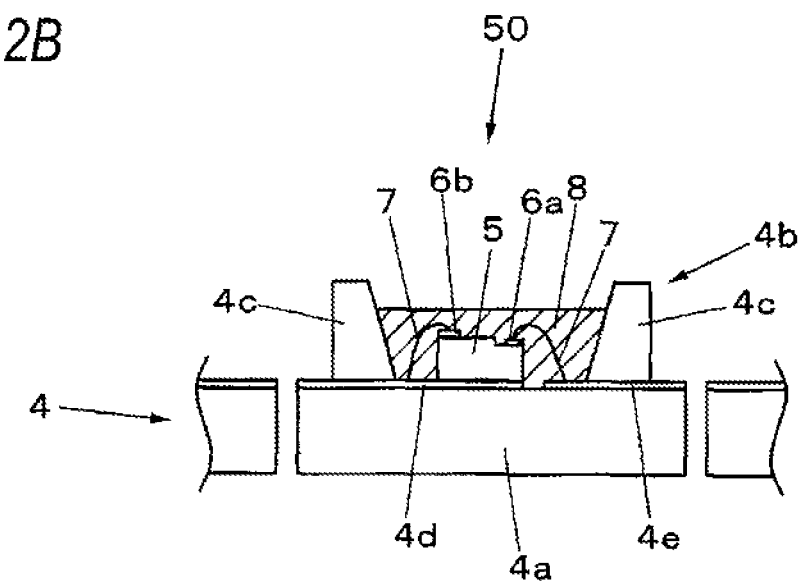

Now, a description will be given of the substrate 4 and the LED element 5 to be worked in the LED package manufacturing system 1, and an LED package 50 as a completed product with reference to FIG. 2 or FIG. 3. As illustrated in FIG. 2A, the substrate 4 is a multiple substrate in which a plurality of piece substrates 4a each forming a base of one LED package 50 in the completed product is formed. Each of the piece substrates 4a is formed with one LED mounting portion 4b in which each of the LED elements 5 is mounted. In each of the piece substrates 4a, the LED element 5 is mounted within the LED mounting portion 4b, and thereafter a resin 8 is coated over the LED element 5 within the LED mounting portion 4b. Further, after the resin 8 has been cured, the processed substrate 4 is cut for each of the piece substrates 4a, to thereby complete the LED package 50 illustrated in FIG. 2B.

The LED package 50 has a function of emitting a white light used as a light source of the various lighting devices, and combines the LED element 5 which is a blue LED with the resin 8 containing the phosphor that emits a yellow fluorescence having a complementary relationship with the blue to obtain an artificial while light. As illustrated in FIG. 2B, a cavity-shaped reflector portion 4c having, for example, a circular or oval annular dam that forms the LED mounting portion 4b is disposed on each of the piece substrates 4a. An n-type electrode 6a and a p-type electrode 6b of the LED element 5 mounted inside of the reflector portion 4c are connected to wiring layers 4e and 4d formed on an upper surface of the piece substrate 4a by bonding wires 7, respectively. Then, the resin 8 covers the LED element 5 of this state, and is coated with a given thickness inside of the reflector portion 4c. In a process in which a blue light emitted from the LED element 5 is transmitted through the resin 8, and irradiated, the blue light is mixed with the yellow light emitted by the phosphor contained in the resin 8, and irradiated as the white light.

As illustrated in FIG. 3A, the LED element 5 laminates an n-type semiconductor 5b and a p-type semiconductor 5c on a sapphire substrate 5a, and further coats a surface of the p-type semiconductor 5c with a transparent electrode 5d. The n-type semiconductor 5b and the p-type semiconductor 5c are formed with an n-type electrode 6a and a p-type electrode 6b for external connection, respectively. As illustrated in FIG. 3B, the LED elements 5 are taken out of an LED wafer 10 adhesively held on a holding sheet 10a in a state where the plurality of LED elements 5 has been divided into the pieces after having been formed in a lump. Due to a variety of error factors in a manufacturing process, for example, due to an uneven composition at the time of forming a film in the wafer, the LED elements 5 divided from the wafer state into the pieces are not prevented from being varied in the light emitting characteristics such as the light emitting wavelength. When the LED elements 5 are mounted on the substrate 4 as they are, the light emitting characteristics of the LED packages 50 as the products are varied.

According to this embodiment, in order to prevent the poor quality attributable to the variation of the light emitting characteristics, the light emitting characteristics of the plurality of LED elements 5 manufactured in the same manufacturing process is measured in advance, the element characteristic information associating the respective LED elements 5 with data indicative of the light emitting characteristics of the LED elements 5 is created in advance, and the resin 8 of an appropriate amount corresponding to the light emitting characteristics of the respective LED elements 5 is coated in coating the resin 8. Then, in order to coat the resin 8 of the appropriate amount, resin coating information to be described later is prepared in advance.

First, the element characteristic information will be described. As illustrated in FIG. 3C, after element IDs (in this example, the individual LED elements 5 are identified by serial numbers (i) in the LED wafer 10) for identifying the respective LED elements 5 are assigned to the LED elements 5 taken out of the LED wafer 10, the LED elements 5 are sequentially loaded to a light emitting characteristic measurement device 11. If the element ID is information that can specify the LED elements 5, individually, another data format, for example, matrix coordinates representing a matrix of the LED elements 5 in the LED wafer 10 may be used as they are. With the use of the element IDs of this format, the LED elements 5 can be supplied while being held in a state of the LED wafer 10, in the component mounting device M1 which will be described later.

In the light emitting characteristic measurement device 11, an electric power is supplied to the respective LED elements 5 through a probe to really emit a light. The light is spectroscopically analyzed to measure given items such as the light emitting wavelength and the light emitting intensity. In the LED elements 5 to be measured, a standard distribution of the light emitting wavelengths is prepared as reference data in advance, and a wavelength range corresponding to a standard range in the distribution is sectioned into a plurality of wavelength bands. With the above configuration, the plurality of LED elements 5 to be measured is rated according to the light emitting wavelength. In this example, Bin codes [1], [2], [3], [4], and [5] are assigned to the respective ranks set by sectioning the wavelength range into five pieces in the order from a low wavelength side. Then, element characteristic information 12 of a data formation associating Bin codes 12b with element IDs 12a is created.

That is, the element characteristic information 12 is information obtained by measuring the light emitting characteristics including the light emitting wavelengths of the plurality of LED elements 5 in advance, individually. The element characteristic information 12 is prepared by LED element manufacturers in advance, and transmitted to the LED package manufacturing system 1. As a transmission configuration of the element characteristic information 12, the element characteristic information 12 may be transmitted in the form of being record in an independent recording medium, or may be transmitted to the management computer 3 through the LAN system 2. In any cases, the transmitted element characteristic information 12 may be stored in the management computer 3, and supplied to the component mounting device M1 as occasion demands.

The plurality of LED elements 5 that has been thus subjected to the light emitting characteristic measurement is sorted for each of characteristic ranks as illustrated in FIG. 3D, sorted to five kinds according to the respective characteristic ranks, and adhered to five adhesive sheets 13a, individually. As a result, three kinds of LED sheets 13A, 13B, 13C, 13D, and 13E in which the LED elements 5 corresponding to the respective Bin codes [1], [2], [3], [4], and [5] are adhesively held on the adhesive sheets 13a are prepared. When those LED elements 5 are mounted on the piece substrates 4a of the substrate 4, the LED elements 5 are supplied to the component mounting device M1 in the configuration of the LED sheets 13A, 13B, 13C, 13D, and 13E that have thus already been rated. In this situation, the element characteristic information 12 is provided from the management computer 3 in the form of which of the Bin codes [1], [2], [3], [4], and [5] the LED element 5 corresponding to is held in each of the LED sheets 13A, 13B, 13C, 13D, and 13E.

Subsequently, the resin coating information prepared to correspond to the above-mentioned element characteristic information 12 in advance will be described with reference to FIG. 4. In the LED package 50 of the configuration that obtains the white write by combination of the blue LED with the YAG phosphor, the blue light emitted by the LED elements 5 is additively mixed with the yellow light emitted from the phosphor excited by the blue light. For that reason, the amount of phosphor grains within the recessed LED mounting portion 4b in which each of the LED elements 5 is mounted becomes an important element in ensuring the regular light emitting characteristics of the LED package 50 as the product.

As described above, the variations classified by the Bin codes [1], [2], [3], [4], and [5] are present in the light emitting wavelengths of the plurality of LED elements 5 to be worked at the same time. For that reason, an appropriate amount of the phosphor grains in the resin 8 coated over the LED elements 5 is different according to the Bin codes [1]. [2], [3], [4], and [5]. In resin coating information 14 prepared in this embodiment, as illustrated in FIG. 4, a Bin categorical appropriate resin coating amount of the resin 8 containing the YAG phosphor grains in a silicone resin or an epoxy resin is defined on an nl (nanoliter) unit according to a Bin code segment 17 in advance. That is, when the resin 8 of an appropriate resin coating amount indicated by the resin coating information 14 is accurately coated over each of the LED elements 5, the amount of phosphor grains in the resin that covers the LED element 5 becomes an appropriate phosphor grain supply amount, to thereby ensure a regular light emitting wavelength obtained for the completed product after the resin has been thermally cured.

In this example, as illustrated in the phosphor concentration column 16, a plurality of phosphor concentrations (in this example, three kinds of D1 (5%), D2 (10%), and D3 (15%)) indicative of the concentration of the phosphor grains in the resin 8 is set, and numeral values corresponding to the phosphor concentrations of the resin 8 also using the appropriate resin coating amount of the resin 8 are used. That is, when the resin of the phosphor concentration D1 is coated, the resin 8 of appropriate resin coating amounts VA0, VB0, VC0, VD0, and VE0 (appropriate resin coating amount 15(1)) is coated on the respective Bin codes [1], [2], [3], [4], and [5]. Likewise, when the resin of the phosphor concentration D2 is coated, the resin 8 of appropriate resin coating amounts VF0, VG0, VH0, VJ0, and VK0 (appropriate resin coating amount 15(2)) is coated on the respective Bin codes [1], [2], [3], [4], and [5]. Also, when the resin of the phosphor concentration D3 is coated, the resin 8 of appropriate resin coating amounts VL0, VM0, VN0, VP0, and VR0 (appropriate resin coating amount 15(3)) is coated on the respective Bin codes [1], [2], [3], [4], and [5]. The reason why the appropriate resin coating amount is thus set for each of the plurality of different phosphor concentrations is because it is more preferable to coat the resin 8 of the appropriate phosphor concentration according to the degree of variation of the light emitting wavelength, from the viewpoint of the quality assurance.

Figure 5A:
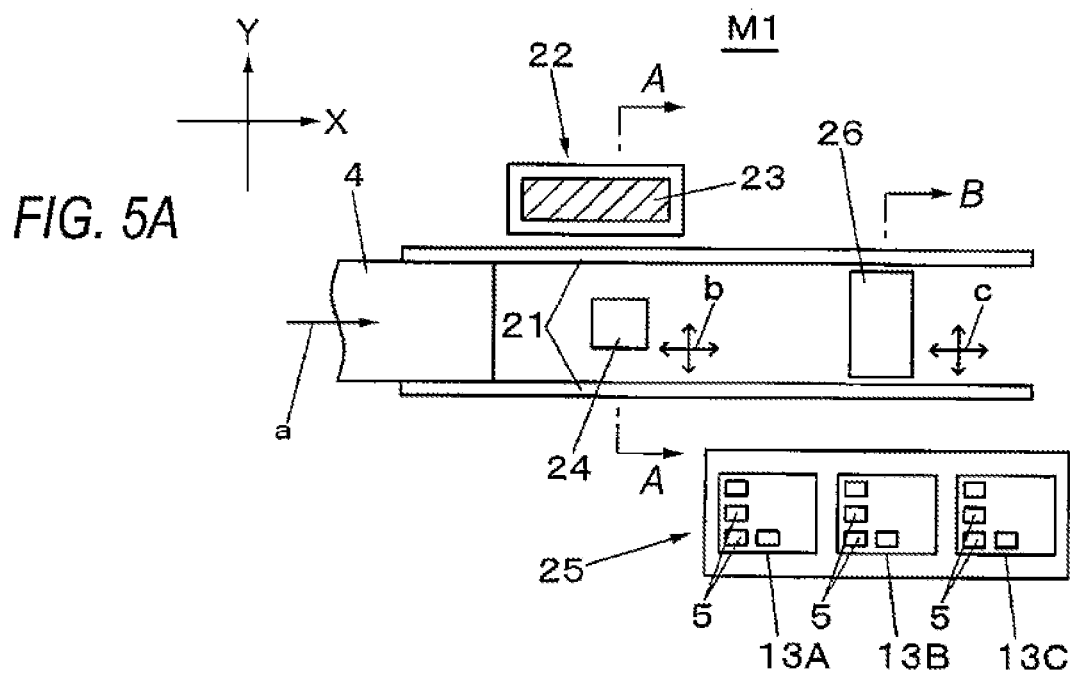
FIGS. 5A, 5B, and 5C are illustrative views of a configuration and a function of a component mounting device in the LED package manufacturing system according to the embodiment of the present invention.

Subsequently, the configuration and the function of the component mounting device M1 will be described with reference to FIG. 5. As illustrated in a plan view of FIG. 5A, the component mounting device M1 includes a substrate transport mechanism 21 that transports the substrate 4 to be worked which is supplied from an upstream side in a substrate transport direction (arrow a). In the substrate transport mechanism 21, an adhesive coating portion A illustrated by a cross-section A-A in FIG. 5B, and a component mounting portion B illustrated by a cross-section B-B in FIG. 4C are arranged in the order from the upstream side. The adhesive coating portion A includes an adhesive supply unit 22 that is arranged laterally of the substrate transport mechanism 21, and supplies a resin adhesive 23 in the form of a coating having a given thickness, and an adhesive transfer mechanism 24 that is movable in a horizontal direction (arrow b) above the substrate transport mechanism 21 and the adhesive supply unit 22. Also, the component mounting portion B includes a component supply mechanism 25 that is arranged laterally of the substrate transport mechanism 21, and holds the LED sheets 13A, 13B, 13C, 130, and 13E, and a component mounting mechanism 26 that is movable in the horizontal direction (arrow c) above the substrate transport mechanism 21 and the component supply mechanism 25.

Figure 5B:
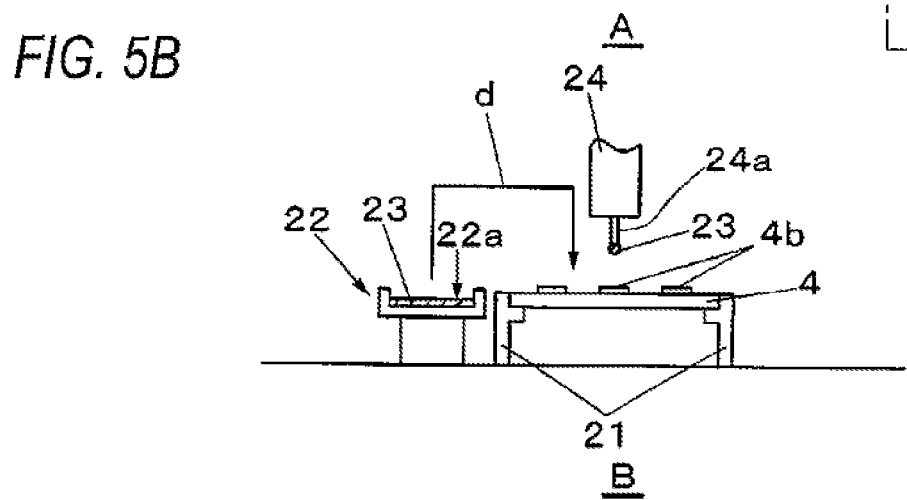

As illustrated in FIG. 5B, the substrate 4 carried into the substrate transport mechanism 21 is positioned in the adhesive coating portion A, and the resin adhesive 23 is coated on the LED mounting portion 4b formed in each of the piece substrates 4a. That is, the adhesive transfer mechanism 24 is first moved above the adhesive supply unit 22, brings a transfer pin 24a in contact with a coating film of the resin adhesive 23 formed on a transfer surface 22a, and attaches the resin adhesive 23 to the transfer pin 24a. Then, the adhesive transfer mechanism 24 is moved above the substrate 4, the transfer pin 24a is moved down to the LED mounting portion 4b (arrow d), and the resin adhesive 23 attached to the transfer pin 24a is supplied to an element mounting position within the LED mounting portion 4b by transferring.

Figure 5C:
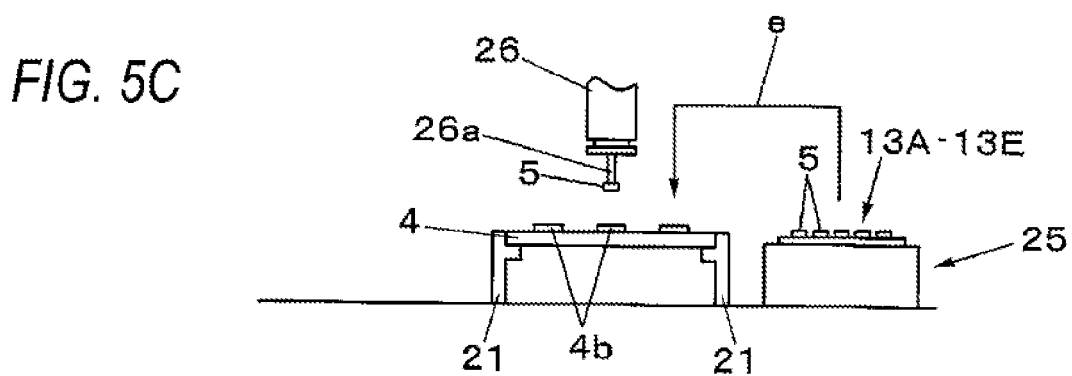

Then, the substrate 4 that has been coated with the adhesive is transported to a downstream side, and positioned by the component mounting portion B as illustrated in FIG. 5C, and the LED elements 5 are mounted on the respective LED mounting portions 4b that have been supplied with the adhesive. That is, the component mounting mechanism 26 is first moved above the component supply mechanism 25, a mounting nozzle 26a is moved down to any one of the LED sheets 13A, 13B, 13C, 13D, and 13E which are held by the component supply mechanism 25, and the LED element 5 is held and taken out by the mounting nozzle 26a. Then, the component mounting mechanism 26 is moved above the LED mounting portion 4b of the substrate 4, and the mounting nozzle 26a is moved down (arrow e) whereby the LED element 5 held by the mounting nozzle 26a is mounted at the element mounting position coated with the adhesive within the LED mounting portion 4b.

In the mounting of the LED elements 5 onto the substrate 4 by the component mounting device M1, a component mounting operation is executed according to an element mounting program created in advance. In the element mounting program, an order of taking out the LED element 5 from any of the LED sheets 13A, 13B, 13C, 13D, and 13E, and mounting the respective LED elements 5 on the plurality of piece substrates 4a of the substrate 4 is preset.

In the execution of the component mounting operation, mounting position information 71a (refer to FIG. 9) indicating on which of the plural piece substrates 4a of the substrate 4 the individual LED element 5 is mounted is extracted from the operation execution history, and recorded. Data associating the mounting position information 71a with the element characteristic information 12 indicating to which of the characteristic ranks (Bin codes [1], [2], [3], [4], and [5]) the LED elements 5 mounted on the individual piece substrates 4a correspond is created as map data 18 illustrated in FIG. 6 by a map creation processing unit 74 (refer to FIG. 9).

Figure 6:
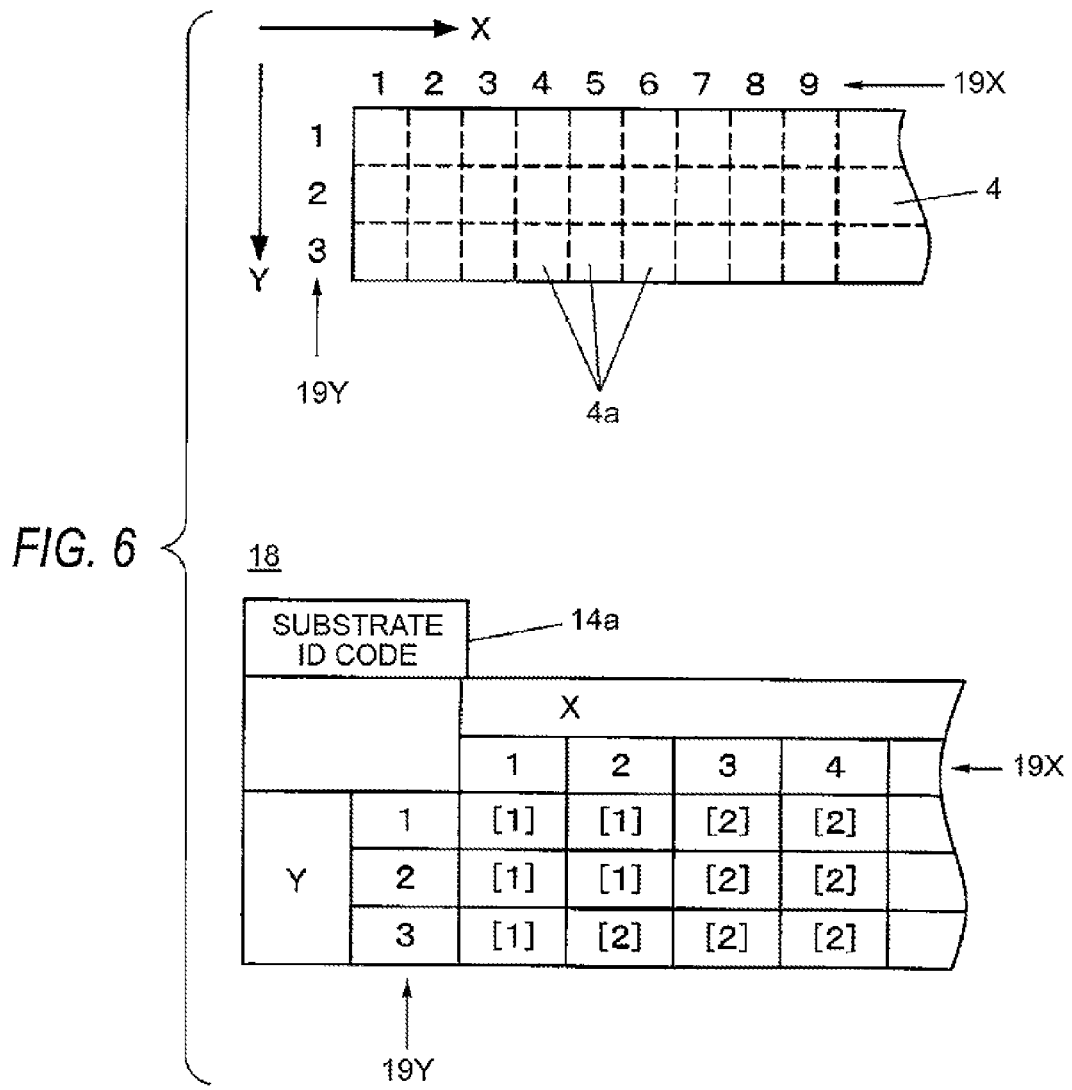
FIG. 6 is an illustrative view of map data used in the LED package manufacturing system according to the embodiment of the present invention.

Referring to FIG. 6, the individual position of the plurality of piece substrates 4a in the substrate 4 is specified by the combination of matrix coordinates 19X and 19Y indicative of positions in an X-direction and a Y-direction, respectively. The Bin codes to which the LED elements 5 mounted at the positions belong are allowed to correspond to the individual cells of the matrix configured by the matrix coordinates 19X and 19Y. With the above configuration, the map data 18 associating the mounting position information 71a indicative of the positions of the LED elements 5 mounted by the component mounting device M1 on the substrate 4, with the element characteristic information 12 on the LED elements 5 is created.

That is, the component mounting device M1 is configured to include the map creation processing unit 74 as map data creating unit for creating the map data 18 associating the mounting position information indicative of the positions of the LED elements 5 mounted by the above device on the substrate 4 with the element characteristic information 12 on the LED elements 5 for each substrate 4. The map data 18 thus created is transmitted to the resin coating device M4 described below through the LAN system 2 as feed forward data.

Subsequently, the configuration and the function of the resin coating device M4 will be described with reference to FIGS. 7 and 8. The resin coating device M4 has a function of coating the resin 8 over the plurality of LED elements 5 mounted on the substrate 4 by the component mounting device M1. As illustrated in a plan view of FIG. 7A, the resin coating device M4 is configured to arrange a resin coating portion C indicated by a cross-section C-C in FIG. 7B in a substrate transport mechanism 31 that transports the substrate 4 to be worked, which is supplied from the upstream side, in a substrate transport direction (arrow f). The resin coating portion C is provided with a resin discharge head 32 configured to discharge the resin 8 from a discharge nozzle 33a mounted on a lower end portion.

Figure 7A:
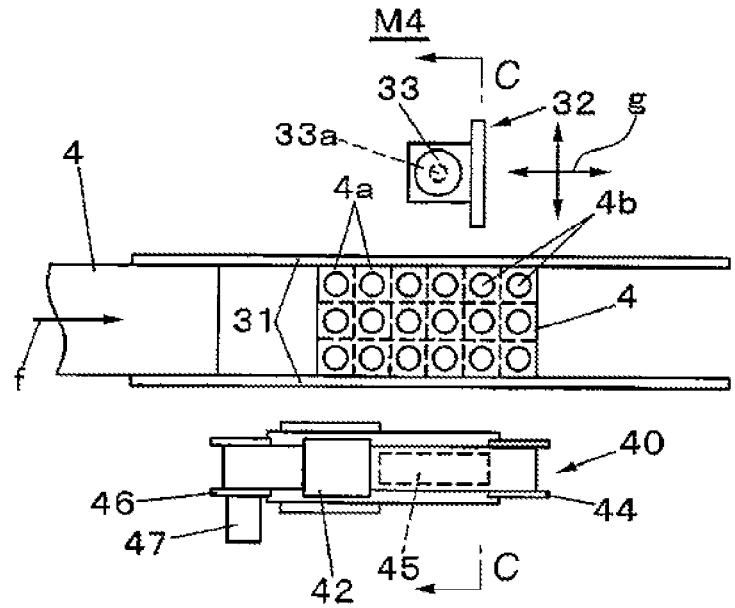
FIGS. 7A and 7B are illustrative views of a configuration and a function of a resin coating device in the LED package manufacturing system according to the embodiment of the present invention.
Figure 7B:
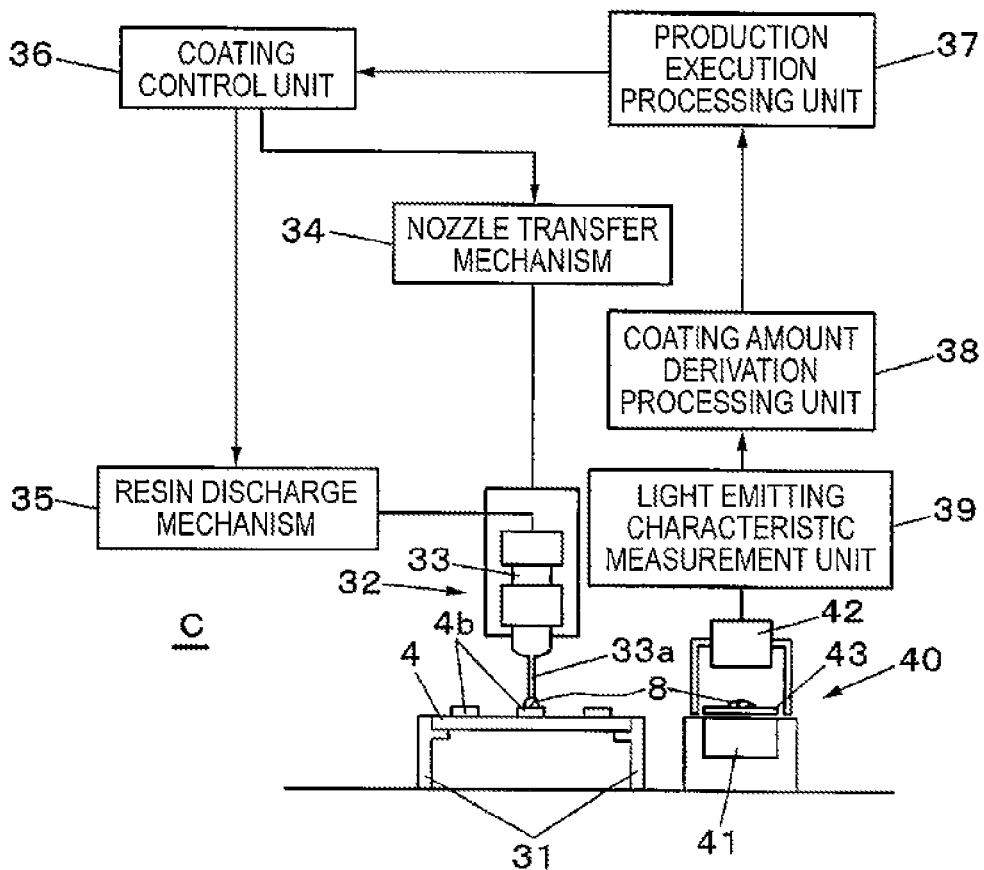

As illustrated in FIG. 7B, the resin discharge head 32 is driven by a nozzle transfer mechanism 34, and the nozzle transfer mechanism 34 is controlled by a coating control unit 36, to thereby conduct the travel operation and the move up/down operation in the horizontal direction (arrow g indicated in FIG. 7A). The resin 8 is supplied to the resin discharge head 32 in a state where the resin 8 is accommodated in a syringe fitted to a dispenser 33, and an air pressure is applied into the dispenser 33 by a resin discharge mechanism 35, as a result of which the resin 8 within the dispenser 33 is discharged through the discharge nozzle 33a, and coated on the LED mounting portion 4b formed on the substrate 4. In this situation, the resin discharge mechanism 35 is controlled by the coating control unit 36 whereby the amount of discharge of the resin 8 can be arbitrarily controlled. That is, the resin coating portion C has a function of variably discharging the coating amount of the resin 8, and coating the resin 8 at an arbitrary position to be coated.

Laterally of the substrate transport mechanism 31, a trial coating and measurement unit 40 is located within a movable range of the resin discharge head 32. The trial coating and measurement unit 40 has a function of determining whether the coating amount of resin 8 is proper, or not, by measurement of the light emitting characteristics of the resin 8 coated on trial, prior to real production coating operation of coating the resin 8 on the LED mounting portion 4b of the substrate 4. That is, the light emitting characteristics, when the light is emitted from the measurement light source unit to a translucent member 43 coated with the resin 8 on trial by the resin coating portion C, are measured by a light emitting characteristic measurement unit 39. The measurement result is compared with a preset threshold value. As a result, a coating amount derivation processing unit 38 determines whether the preset resin coating amount specified by the resin coating information 14 illustrated in FIG. 4 is proper, or not.

In the resin 8 containing the phosphor grains therein, its composition and property are not always stable. However, even if the appropriate resin coating amount is set by the resin coating information 14 in advance, the concentration of the phosphor and the resin viscosity are not prevented from being varied with the elapse of a time. For that reason, even if the resin 8 is discharged by the discharge parameter corresponding to the preset appropriate resin coating amount, the resin coating amount per se may be varied from the preset appropriate value, or the amount of supply of the phosphor grains to be naturally supplied may be varied according to a change in the concentration even if the resin coating amount per se is proper.

In order to exclude the above inconveniences, in this embodiment, the trial coating for inspecting whether the phosphor grains of the proper supply amount are supplied, or not, at given intervals, is executed by the resin coating device M4, and the measurement of the light emitting characteristics is further executed on the resin coated on trial. As a result, the amount of supply of the phosphor grains is stabilized according to the original light emitting characteristics. The resin coating portion C provided in the resin coating device M4 according to this embodiment has a function of executing measurement coating processing of coating the resin 8 on the translucent member 43 on trial as the above-mentioned light emitting characteristic measurement, and production coating processing of coating the resin 8 on the LED elements 5 mounted on the substrate 4 as real production, together. The measurement coating processing and the production coating processing are each executed by allowing the coating control unit 36 to control the resin coating portion C.

Figure 8A:
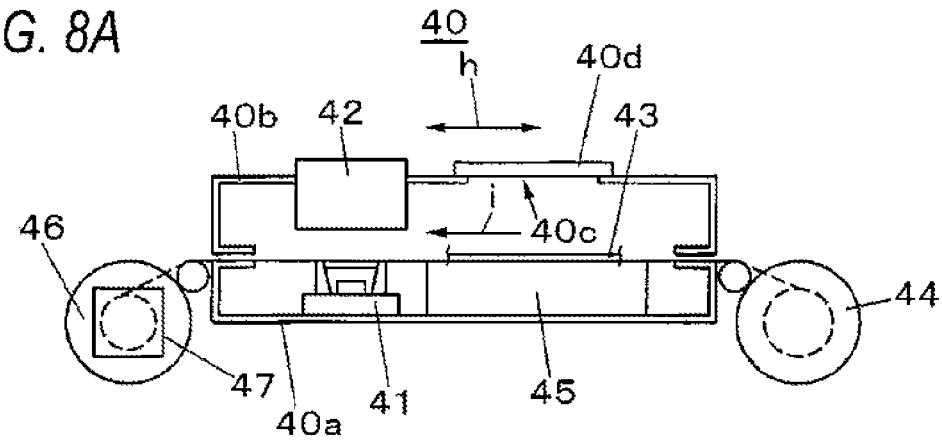
FIGS. 8A, 8B, and 8C are illustrative views of a light emitting characteristic inspection function provided in the resin coating device in the LED package manufacturing system according to the embodiment of the present invention.

As illustrated in FIG. 8, the trial coating and measurement unit 40 is of an external structure in which a cover portion 40b having a coating slide window 40c slidable (arrow h (FIG. 8 also needs to be amended)) with respect to a horizontal slender base portion 40a is arranged. The trial coating and measurement unit 40 includes a trial coating stage 45 that supports the translucent member 43 from a lower surface side, a translucent member mounting portion 41 on which the translucent member 43 is mounted, and a spectroscope 42 that is disposed above the translucent member mounting portion 41. The translucent member mounting portion 41 includes a light source portion that emits an excitation light for exciting the phosphor. The translucent member 43 coated with the resin 8 on trial in the measurement coating processing is irradiated with the excitation light from the lower surface side by the light source unit.

In this embodiment, the LED elements 5 sealed by the resin 8 containing no phosphor therein is used as the light source portion. As a result, the light emitting characteristic measurement of the resin 8 coated on trial can be conducted by a light having the same characteristics as those of the excitation light emitted in the LED package 50 of the completed product, and the inspection results higher in reliability can be obtained. The use of the same LED elements 5 as those used in the completed product is not always essential, but like the LED elements 5, any light source device (for example, blue laser source) that emits a blue light having a constant wavelength can be used as the inspection light source unit.

The translucent member 43 is wounded and accommodated on a supply reel 44, supplied, and fed along an upper surface of the trial coating stage 45 (arrow i). Thereafter, the translucent member 43 passes between the translucent member mounting portion 41 and the spectroscope 42, and is wound on a recovery reel 46 which is driven by a winding motor 47. In this example, as the translucent member 43 are used as a tape material having a given width which is formed of a planar sheet member made of a transparent resin, or an emboss type in which an emboss portion 43a corresponding to a recess shape of the LED package 50 is embossed on the lower surface of the same tape material.

In a state where the coating slide window 40c is slid and opened, an upper surface of the trial coating stage 45 is exposed to above, and the resin 8 can be coated on the translucent member 43 mounted on the upper surface of the trial coating stage 45 on trial by the resin discharge head 32. The trial coating is conducted on the translucent member 43 having a lower surface side supported by the trial coating stage 45 by discharging the resin 8 having a specified coating amount onto the translucent member 43 by the discharge nozzle 33a as illustrated in FIG. 8B.

Figure 8B:
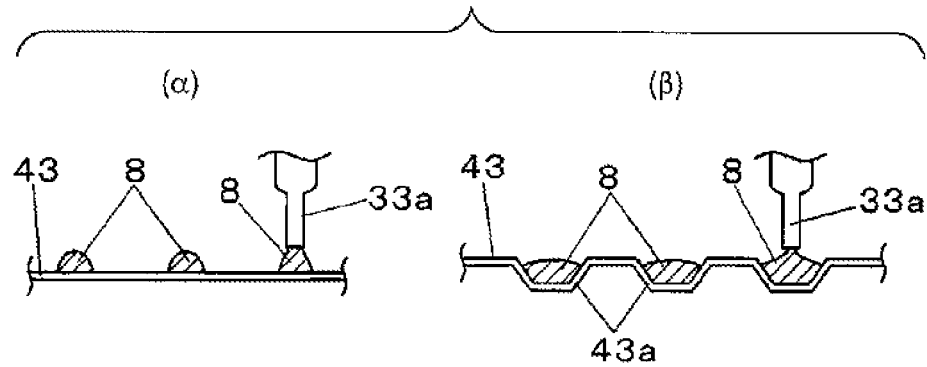

FIG. 8B($\alpha$) illustrates a state in which the resin 8 of the preset appropriate discharge amount defined according to the resin coating information 14 is coated on the translucent member 43 made of the above-mentioned tape material. Also, FIG. 8B($\beta$) illustrates a state in which the resin 8 of the preset appropriate discharge amount is similarly coated in an emboss portion 43a of the translucent member 43 of the above-mentioned emboss type. The resin 8 coated by the trial coating stage 45 is a trial coating for empirically determining whether the phosphor supply amount to the target LED element 5 is proper, or not. For that reason, as will be described later, when the resin 8 is continuously coated on the translucent member 43 at a plurality of points by the same trial coating operation using the resin discharge head 32, coating is conducted while the coating amount is varied step-by-step on the basis of known data representing a correlation relationship between the light emitting characteristic measurement value and the coating amount.

Figure 8C:
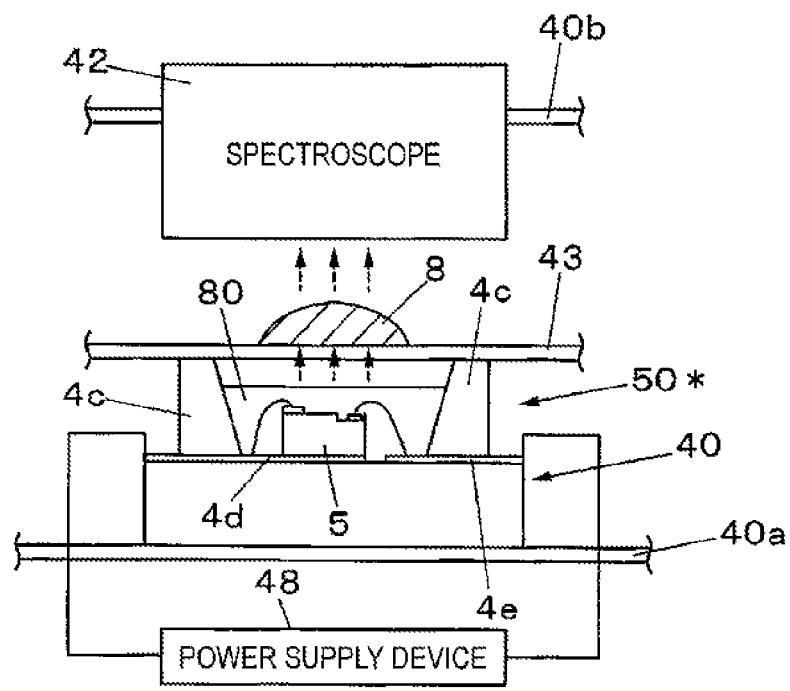

FIG. 8C illustrates a state in which the translucent member 43 coated with the resin 8 by the trial coating stage 45 on trial is moved, the resin 8 is located above the translucent member mounting portion 41, and further the cover portion 40b is moved down to form a light emitting characteristic measurement dark room between the cover portion 40b and the base portion 40a. In the translucent member mounting portion 41, there is used an LED package 50* in which the resin 8 is replaced with a transparent resin 80 containing no phosphor grains in the LED package 50. In the LED package 50*, the wiring layers 4e and 4d connected to the LED element 5 are connected to a power supply device 48. When the power supply device 48 turns on, an electric power for light emission is supplied to the LED elements 5 whereby the LED elements 5 emit the blue light.

In a process in which the blue light is transmitted through the transparent resin 80, and thereafter irradiated onto the resin 8 coated on the translucent member 43 on trial, the phosphor in the resin 8 is excited, and the white light obtained by additively mixing the yellow light emitted by the phosphor with the blue light is emitted upward from the resin 8. The spectroscope 42 is arranged above the trial coating and measurement unit 40, and the white light emitted from the resin 8 is received by the spectroscope 42, and the received white light is analyzed by the light emitting characteristic measurement unit 39 to measure the light emitting characteristics. In this example, the light emitting characteristics such as a color tone rank or a light flux of the white light are inspected, and as a result of the inspection result, a deviation between the measured light emitting characteristics and the specified light emitting characteristics is detected as the inspection result. That is, the light emitting characteristic measurement unit 39 irradiates the resin 8 coated on the translucent member 43 with the excitation light emitted from the LED element 5 which is the light source unit to measure the light emitting characteristics of the light emitted by the resin 8.

The measurement result of the light emitting characteristic measurement unit 39 is transmitted to the coating amount derivation processing unit 38. The coating amount derivation processing unit 38 conducts processing of obtaining a deviation between the measurement result of the light emitting characteristic measurement unit 39 and the light emitting characteristics defined in advance, and deriving the appropriate resin coating amount of the resin 8 to be coated on the LED elements 5 as the real production on the basis of the deviation.

A new appropriate discharge amount derived by the coating amount derivation processing unit 38 is transmitted to a production execution processing unit 37. The production execution processing unit 37 instructs the coating control unit 36 on the appropriate resin coating amount newly derived. As a result, the coating control unit 36 controls the nozzle transfer mechanism 34 and the resin discharge mechanism 35 to allow the resin discharge head 32 to execute the production coating processing of coating the resin 8 of the appropriate resin coating amount on each of the LED elements 5 mounted on the substrate 4.

In the production coating processing, the resin 8 of the appropriate resin coating amount defined according to the resin coating information 14 is first really coated, and the light emitting characteristics are measured in a state the resin 8 is uncured. A good quality product range of the light emitting characteristic measurement value is set when the light emitting characteristics are measured on the resin 8 coated in the production coating on the basis of the obtained measurement result, and the good quality product range is used as a threshold value (refer to threshold data 81a illustrated in FIG. 9) of quality determination in the production coating.

That is, in the resin coating method in the LED package manufacturing system according to this embodiment, the LED elements 5 are used as the light source units for light emitting characteristic measurement. At the same time, as the light emitting characteristics defined in advance which is a basis of the threshold setting of the quality determination in the production coating, there is used the light emitting characteristics that are slanted from the regular light emitting characteristics obtained for the completed product in which the resin 8 coated on each of the LED elements 5 is cured are, by a difference of the light emitting characteristics due to the uncured state of the resin 8. As a result, the control of the resin coating amount in the process of coating the resin on the LED elements 5 can be conducted on the basis of the regular light emitting characteristics of the completed product.

Subsequently, a description will be given of a configuration of a control system in the LED package manufacturing system 1 with reference to FIG. 9. In this example, in the constituent elements of the respective devices configuring the LED package manufacturing system 1, the management computer 3, the component mounting device M1, and the resin coating device M4 represent the constituent elements related to the transmission and reception and updating processing of the element characteristic information 12, the resin coating information 14, the map data 18, and the above-mentioned threshold data 81a.

Figure 9:
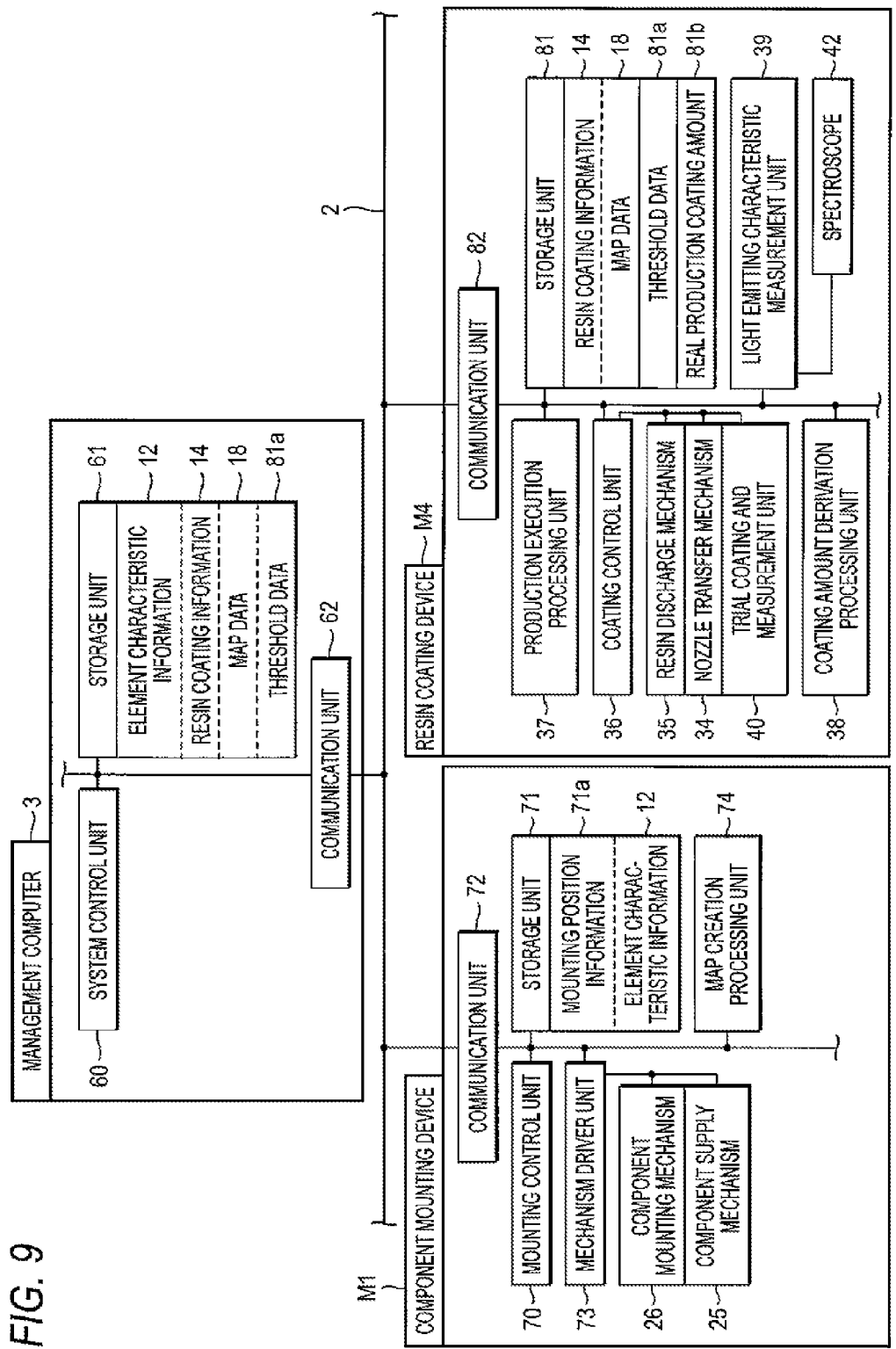
FIG. 9 is a block diagram illustrating a configuration of a control system in the LED package manufacturing system according to the embodiment of the present invention.

Referring to FIG. 9, the management computer 3 includes a system control unit 60, a storage unit 61, and a communication unit 62. The system control unit 60 controls an LED package manufacturing operation by the LED package manufacturing system 1 in the lump. In the storage unit 61 are stored a program and data necessary for control processing by the system control unit 60 as well as the element characteristic information 12, the resin coating information 14, and further as occasion demands, the map data 18 and the threshold data 81a. The communication unit 62 is connected to other devices through the LAN system 2, and transfer a control signal and data. The element characteristic information 12 and the resin coating information 14 are transmitted from the external through the LAN system 2 and the communication unit 62, or via an independent storage medium such as a CD ROM, and stored in the storage unit 61.

The component mounting device M1 includes a mounting control unit 70, a storage unit 71, a communication unit 72, a mechanism driver unit 73, and the map creation processing unit 74. In order to allow the component mounting device M1 to execute the component mounting operation, the mounting control unit 70 controls the respective units described below, on the basis of a variety of programs and data stored in the storage unit 71. In the storage unit 71 are stored a program and data necessary for control processing by the system control unit 70 as well as the mounting position information 71a and the element characteristic information 12. The mounting position information 71a is created by execution history data of the execution operation control by the mounting control unit 70. The element characteristic information 12 is transmitted from the management computer 3 through the LAN system 2. The communication unit 72 is connected to other devices through the LAN system 2, and transfers the control signal and the data.

The mechanism driver unit 73 is controlled by the mounting control unit 70, and drives the component supply mechanism 25 and the component mounting mechanism 26. As a result, the LED elements 5 are mounted on the respective piece substrates 4a of the substrate 4. The map creation processing unit 74 (map data creating unit) conducts processing of creating the map data 18 associating the mounting position information 71a indicative of the positions of the LED elements 5 mounted by the component mounting device M1 on the substrate 4 with the element characteristic information 12 on the LED elements 5, which are stored in the storage unit 71 for each substrate 4. That is, the map data creating unit is disposed in the component mounting device M1 and the map data 18 is transmitted from the component mounting device M1 to the resin coating device M4. The map data 18 may be transmitted from the component mounting device M1 to the resin coating device M4 through the management computer 3. In this case, as illustrated in FIG. 9, the map data 18 is also stored in the storage unit 61 of the management computer 3.

The resin coating device M4 includes the coating control unit 36, a storage unit 81, a communication unit 82, the production execution processing unit 37, the coating amount derivation processing unit 38, and the light emitting characteristic measurement unit 39. The coating control unit 36 controls the nozzle transfer mechanism 34, the resin discharge mechanism 35, and the trial coating and measurement unit 40 configuring the resin coating portion C to conduct processing of executing the measurement coating processing of coating the resin 8 on the translucent member 43 on trial as the light emitting characteristic measurement, and the production coating processing of coating the resin 8 on the LED elements 5 as the real production.

In the storage unit 81 are stored a program and data necessary for control processing by the coating control unit 36 as well as the resin coating information 14, the map data 18, and the threshold data 81a, and a real production coating amount 81b. The resin coating information 14 is transmitted from the management computer 3 through the LAN system 2, and likewise the map data 18 is transmitted from the component mounting device M1 through the LAN system 2. The communication unit 82 is connected to other devices through the LAN system 2, and transfers the control signal and the data.

The light emitting characteristic measurement unit 39 conducts processing of irradiating the resin 8 coated on the translucent member 43 with the excitation light emitted from the LED elements 5 which are the light source units to measure the light emitting characteristics of a light emitted by this resin. The coating amount derivation processing unit 38 conducts arithmetic processing of obtaining a deviation between the measurement result of the light emitting characteristic measurement unit 39 and the light emitting characteristics defined in advance, and deriving the appropriate resin coating amount of the resin 8 to be coated on the LED elements 5 as the real production on the basis of the deviation. The production execution processing unit 37 instructs the coating control unit 36 on the appropriate resin coating amount derived by the coating amount derivation processing unit 38 to execute the production coating processing of coating the resin of the appropriate resin coating amount on the LED elements 5.

In the configuration illustrated in FIG. 9, the processing function other than the function for executing the work operation specific to the respective devices, for example, the function of the map creation processing unit 74 provided in the component mounting device M1, and the function of the coating amount derivation processing unit 38 provided in the resin coating device M4 do not always need to be attached to the above devices. For example, the functions of the map creation processing unit 74 and the coating amount derivation processing unit 38 may be covered by the arithmetic processing function provided in the system control unit 60 of the management computer 3 to transfer necessary signal through the LAN system 2.

In the configuration of the LED package manufacturing system 1 described above, both of the component mounting device M1 and the resin coating device M4 are connected to the LAN system 2. The management computer 3 in which the element characteristic information 12 is stored in the storage unit 61, and the LAN system 2 configure element characteristic information providing unit for providing the component mounting device M1 with information obtained by measuring the light emitting characteristics including the light emitting wavelengths of the plurality of LED elements 5 in advance, individually, as the element characteristic information 12. Likewise, the management computer 3 in which the resin coating information 14 is stored in the storage unit 61, and the LAN system 2 configure resin information providing unit for providing the resin coating device M4 with information associating the appropriate resin coating amount of the resin 8 for obtaining the LED package 50 having the specified light emitting characteristics with the element characteristic information, as the resin coating information.

That is, the element characteristic information providing unit for providing the component mounting device M1 with the element characteristic information 12 and the resin information providing unit for providing the resin coating device M4 with the resin coating information 14 are configured to transmit the element characteristic information and the resin coating information read from the storage unit 61 in the management computer 3, which is external storage unit, to the component mounting device M1 and the resin coating device M4 through the LAN system 2, respectively.

Figure 10:
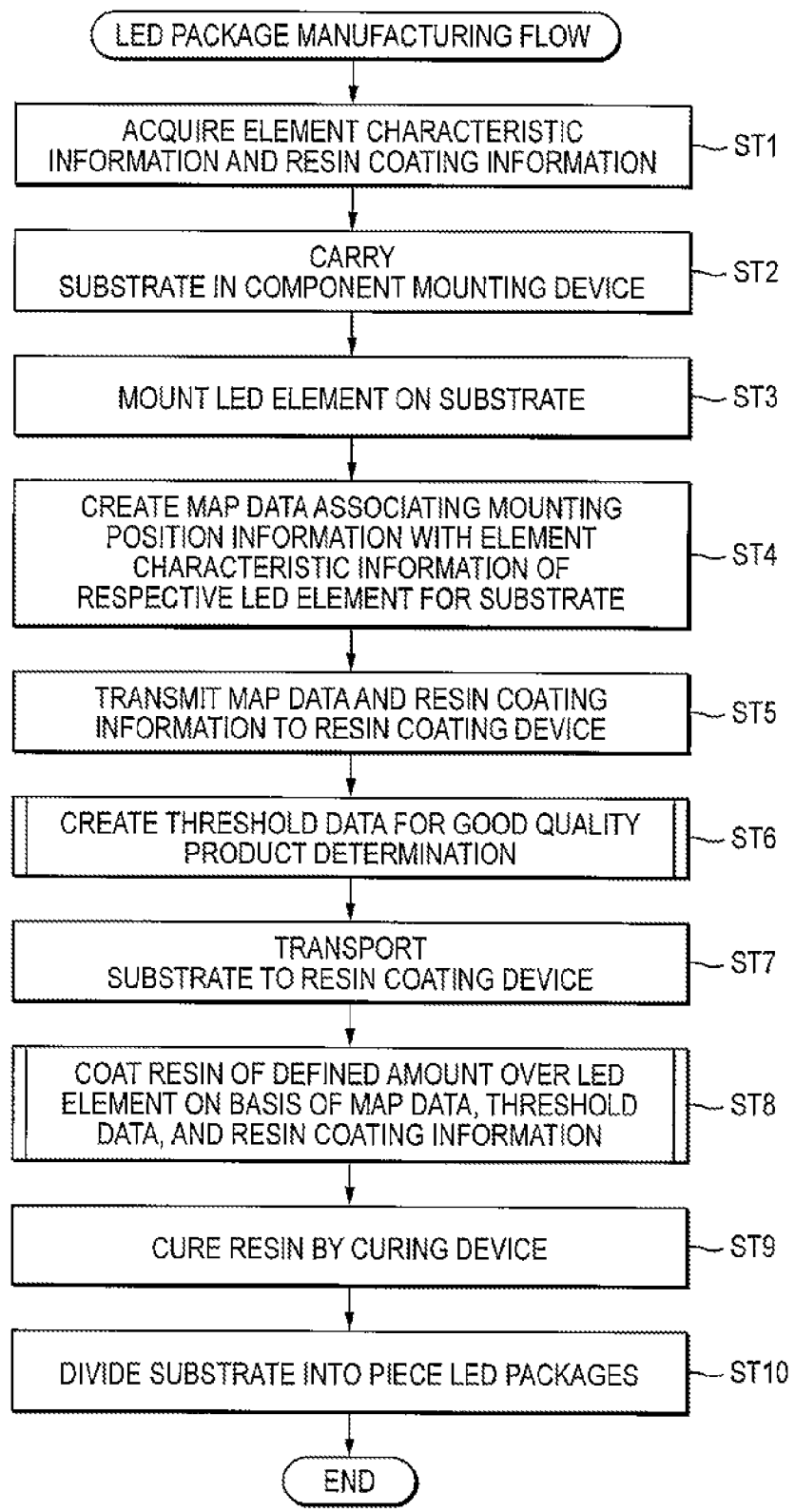
FIG. 10 is a flowchart of LED package manufacture in the LED package manufacturing system according to the embodiment of the present invention.

Subsequently, an LED package manufacturing process executed by the LED package manufacturing system 1 will be described along a flow of FIG. 10 with reference to the respective drawings. First, the LED package manufacturing system 1 acquires the element characteristic information 12 and the resin coating information 14 (ST1). That is, the LED package manufacturing system 1 acquires the element characteristic information 12 obtained by measuring the light emitting characteristics including the light emitting wavelengths of the plurality of LED elements 5 in advance, individually, and the resin coating information 14 associating the appropriate resin coating amount of the resin 8 for obtaining the transparent resin 80 having the specified light emitting characteristics with the element characteristic information 12, from the external device through the LAN system 2, or via the storage medium.

Figure 16A:
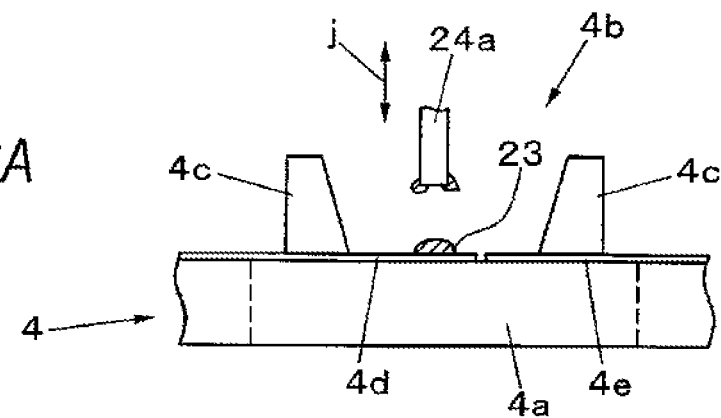
FIGS. 16A, 16B, 16C, and 16D are illustrative views illustrating steps of the LED package manufacturing process in the LED package manufacturing system according to the embodiment of the present invention.
Figure 16B:
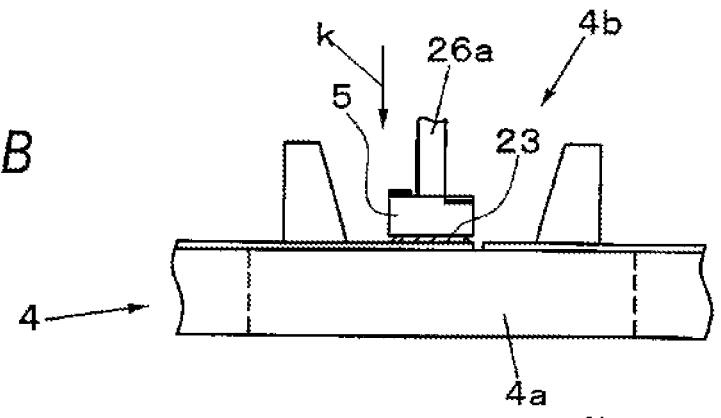

Thereafter, the substrate 4 to be mounted is carried in the component mounting device M1 (ST2). Then, as illustrated in FIG. 16A, the transfer pin 24a of the adhesive transfer mechanism 24 is moved up and down (arrow j) to supply the resin adhesive 23 to the element mounting position within the LED mounting portion 4b. Thereafter, as illustrated in FIG. 16B, the LED element 5 held by the mounting nozzle 26a of the component mounting mechanism 26 is moved down (arrow k), and mounted within the LED mounting portion 4b of the substrate 4 through the resin adhesive 23 (ST3). Then, the map data 18 associating the mounting position information 71a with the element characteristic information 12 of the respective LED elements 5 for the substrate 4 is created by the map creation processing unit 74 from the execution data of the component mounting operation (ST4). Then, the map data 18 is transmitted to the resin coating device M4 from the component mounting device M1 and also the resin coating information 14 is transmitted to the resin coating device M4 from the management computer 3 (ST5). As a result, the resin coating operation is executable by the resin coating device M4.

Figure 16C:
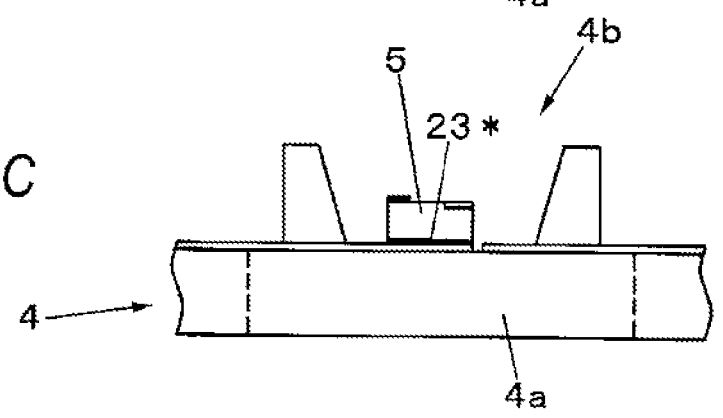
Figure 16D:
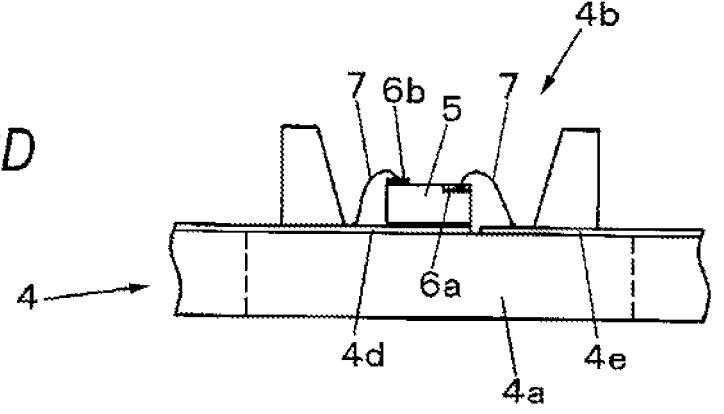

Subsequently, the substrate 4 on which the component has been mounted is transmitted to the curing device M2, and heated, as a result of which, as illustrated in FIG. 16C, the resin adhesive 23 is thermally cured into the resin adhesive 23\*, and each of the LED elements 5 is fixed to the piece substrate 4a. Then, the substrate 4 on which the resin has been cured is transmitted to the wire bonding device M3, and as illustrated in FIG. 16D, the wiring layers 4e and 4d of the piece substrate 4a are connected to the n-type electrode 6a and the p-type electrode 6b of the LED element 5 by the bonding wires 7.

Figure 11:
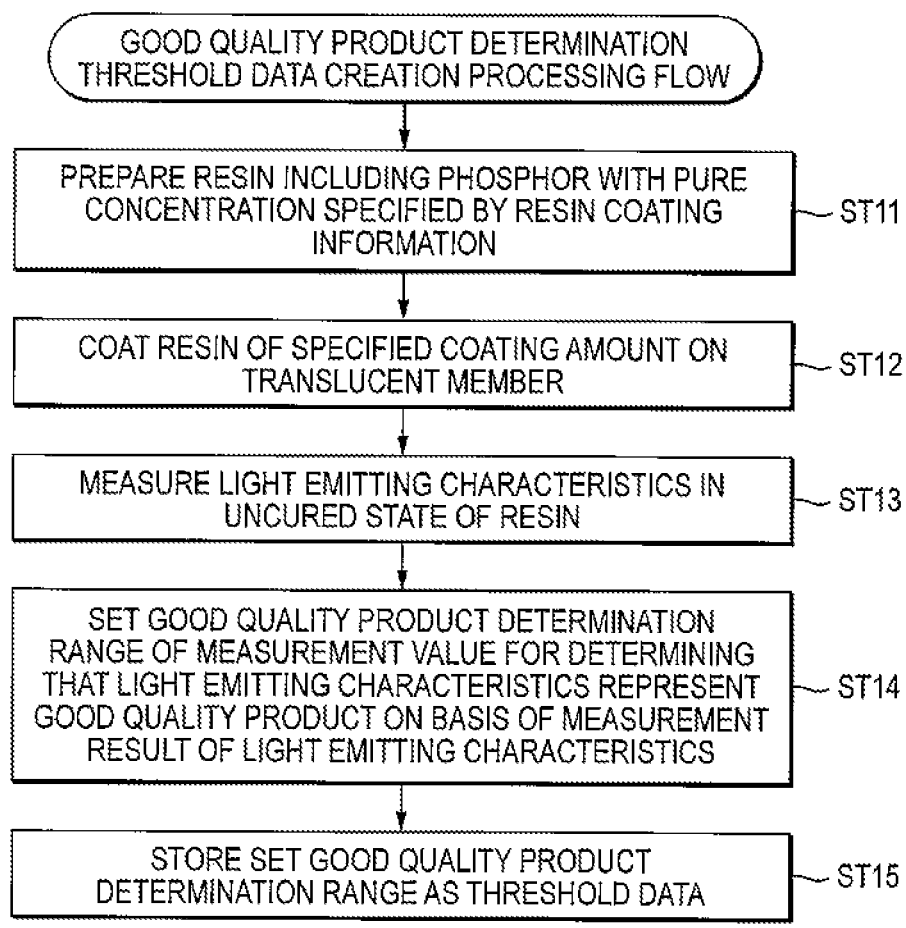
FIG. 11 is a flowchart of threshold data creation processing for non-defective product determination in the LED package manufacturing system according to the embodiment of the present invention.
Figure 13:
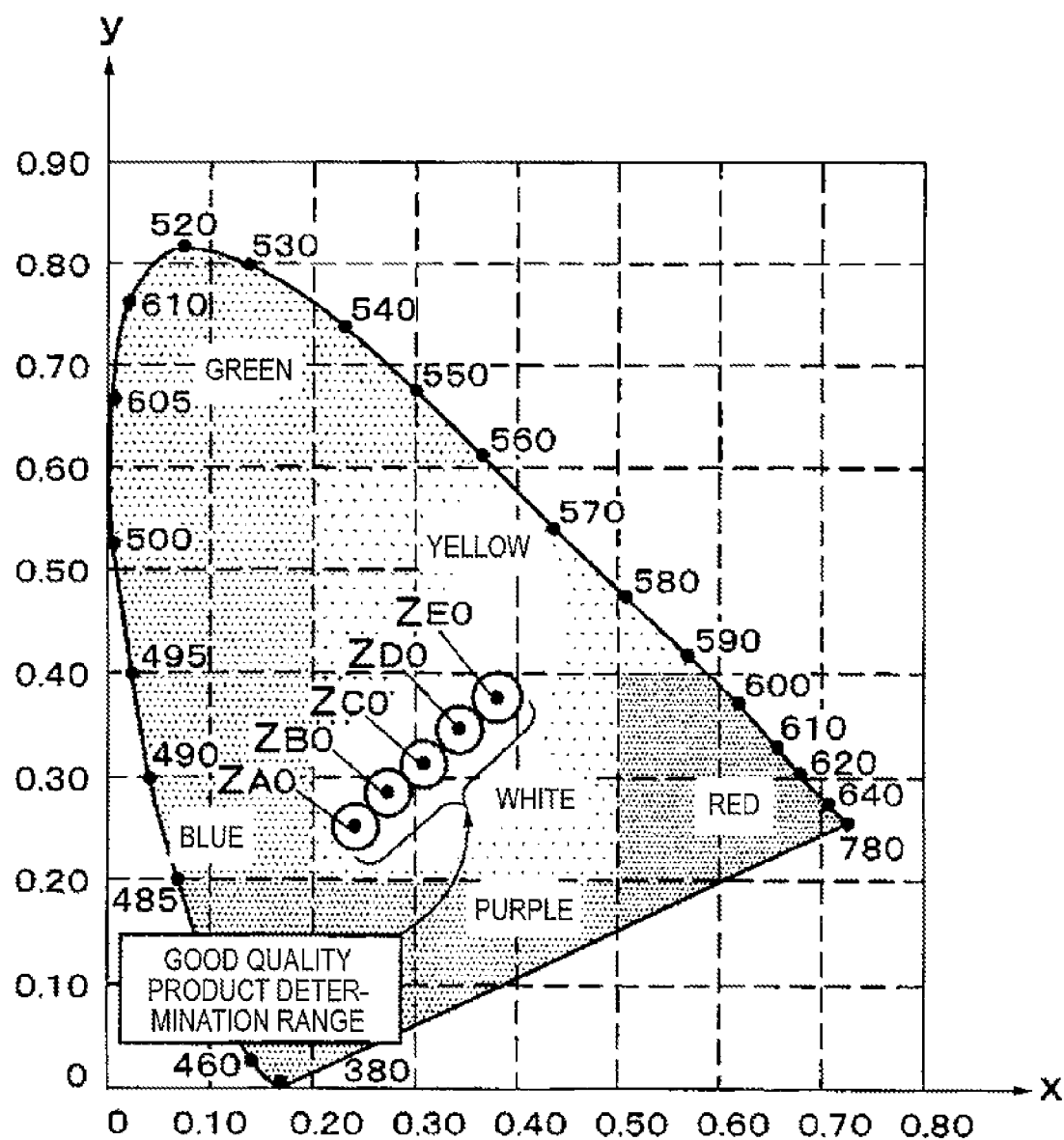
FIG. 13 is a chromaticity diagram illustrating the threshold data for the non-defective product determination in the LED package manufacturing system according to the embodiment of the present invention.

Then, the LED package manufacturing system 1 executes the threshold data creation processing for the quality determination (ST6). This processing is executed to set the threshold value (refer to the threshold data 81a illustrated in FIG. 9) of the quality determination in the production coating, and the respective production coatings corresponding to the Bin codes [1], [2], [3], [4], and [5] are iteratively executed. The details of the threshold data creation processing will be described with reference to FIGS. 11, 12, and 13. Referring to FIG. 11, the resin 8 containing the phosphor with a pure concentration specified by the resin coating information 14 is prepared (ST11). Then, after the resin 8 has been set for the resin discharge head 32, the resin discharge head 32 is moved to the trial coating stage 45 of the trial coating and measurement unit 40 to coat the resin 8 of the specified coating amount (appropriate resin coating amount) specified by the resin coating information 14 on the translucent member 43 (ST12). Then, the resin 8 coated on the translucent member 43 is moved onto the translucent member mounting portion 41, and the LED element 5 emits a light to measure the light emitting characteristics in a state where the resin 8 is uncured, by the light emitting characteristic measurement unit 39 (ST13). Then, the good quality product determination range of the measurement value for determining that the light emitting characteristics are indicative of the good quality product is set on the basis of a light emitting characteristic measurement value 39a which is the measurement result of the light emitting characteristics measured by the light emitting characteristic measurement unit 39 (ST14). The set good quality product determination range is stored in the storage unit 81 as the threshold data 81a, and also transferred to the management computer 3 and stored in the storage unit 61 (ST15).

FIG. 12 illustrates the threshold data thus created, that is, the good quality product determination range (threshold value) of the measurement value for determining, as the good quality product, the light emitting characteristic measurement value and the light emitting characteristics obtained in the uncured state of the resin after the resin 8 containing the phosphor of the pure content therein has been coated. FIGS. 12A, 12B, and 12C illustrate the threshold values corresponding to the Bin codes [1], [2]. [3], [4], and [5] when the phosphor concentration in the resin 8 is 5%, 10%, and 15%.

For example, as illustrated in FIG. 12A, in the case where the phosphor concentration of the resin 8 is 5%, the coating amounts indicated by the respective appropriate resin coating amount 15(1) correspond to the respective Bin codes 12b. The measurement results obtained by measuring the light emitting characteristics of the light emitted from the resin 8 by the light emitting characteristic measurement unit 39 by irradiating the resin 8 coated with the respective coating amounts with the blue light of the LED elements 5 are indicated by the light emitting characteristic measurement values 39a(1). Then, the threshold data 81a(1) is set on the basis of the respective light emitting characteristic measurement values 39a(1). For example, the measurement results obtained by measuring the light emitting characteristics of the resin 8 coated with the appropriate resin coating amount VA0 corresponding to the Bin code [1] are represented by chromaticity coordinates ZA0 ($X_{A0}$, $Y_{A0}$) on a chromaticity table illustrated in FIG. 13. Given ranges (for example, ±10%) of the X coordinate and the Y coordinate on the chromaticity table, relative to the chromaticity coordinates ZA0 are as the good quality product determination range (threshold value). Likewise, in the appropriate resin coating amounts corresponding to the other Bin codes [2] to [5], the respective good quality product determination ranges (threshold values) are set on the basis of the light emitting characteristic measurement results (refer to the chromaticity coordinates ZB0 to ZE0 on the chromaticity table illustrated in FIG. 13). In this example, the given range set as the threshold value is appropriately set according to a precision level of the light emitting characteristics obtained for the LED package 50 as the product.

FIGS. 12B and 12C illustrate the light emitting characteristic measurement values and the good quality product determination ranges (threshold values) when the respective phosphor concentrations of the resin 8 are 10% and 15%, likewise. In FIGS. 12B and 12C, the appropriate resin coating amount 15(2) and the appropriate resin coating amount 15(3) represent the appropriate resin coating amounts when the respective phosphor concentrations are 10% and 15%. Also, the light emitting characteristic measurement unit 39a(2) and the light emitting characteristic measurement unit 39a(3) represent the light emitting characteristic measurement values when the respective phosphor concentrations are 10% and 15%, and the threshold data 81a(2) and the threshold data 81a(3) represent the good quality product determination ranges (threshold values) in the respective cases. The threshold data thus created is selectively used according to the Bin code 12b to which the target LED element 5 belongs in the production coating operation. The threshold data creation processing represented in (ST6) may be executed as off-line operation by an independent inspection device provided separately from the LED package manufacturing system 1, and data stored as the threshold data 81a in the management computer 3 in advance may be transmitted to the resin coating device M4 through the LAN system 2.

Figure 17A:
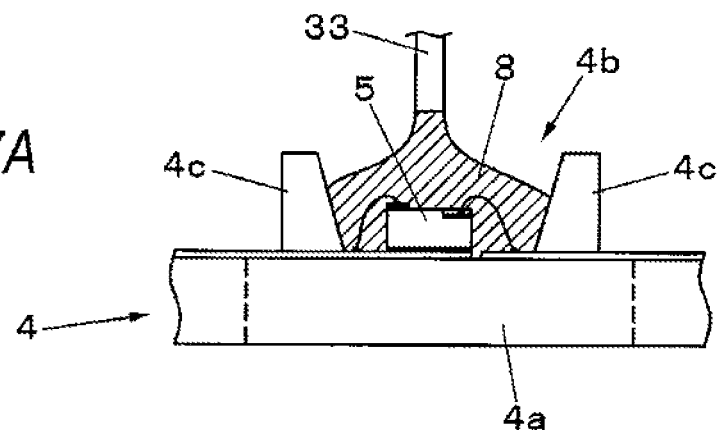
Figure 17B:
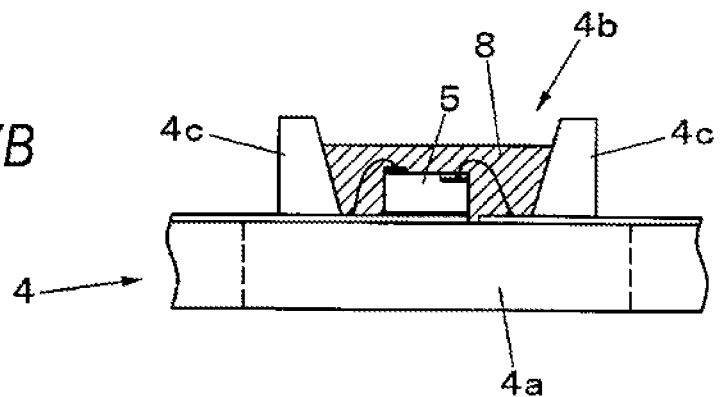

Thereafter, the substrate 4 that has been subjected to the wire bonding is transported to the resin coating device M4 (ST7), and as illustrated in FIG. 17A, the resin 8 is discharged from the discharge nozzle 33a into the LED mounting portion 4b surrounded by the reflector portion 4c. In this example, the operation of coating the resin 8 of the specified amount illustrated in FIG. 17B over the LED element 5 is executed on the basis of the map data 18, the threshold data 81a, and the resin coating information 14 (ST8). The details of the resin coating operation processing will be described with reference to FIGS. 14 and 15. First, in starting the resin coating operation, the resin storage container is exchanged to another as occasion demands (ST21). That is, the dispenser 33 installed on the resin discharge head 32 is exchanged to another dispenser 33 that stores the resin 8 having the phosphor concentration selected according to the characteristic of the LED element 5.

Subsequently, the resin 8 is coated on translucent member 43 on trial as the light emitting characteristic measurement by the resin coating portion C (measurement coating step) (ST22). That is, the resin 8 of the appropriate resin coating amount (VA0 to VE0) for each of the Bin codes 12b specified in FIG. 4 is coated on the translucent member 43 taken out onto the trial coating stage 45 by the trial coating and measurement unit 40. In this situation, even if the resin discharge mechanism 35 is instructed on the discharge operation parameter corresponding to the appropriate resin coating amount (VA0 to VE0), a real resin coating amount discharged from the discharge nozzle 33a and coated on the translucent member 43 does not always match the above-mentioned appropriate resin coating amount due to a variation in the property of the resin 8 with time. As illustrated in FIG. 15A, the real resin coating amounts become VA1 to VE1 slightly different from VA0 to VE0.

Then, with the transmission of the translucent member 43 in the trial coating and measurement unit 40, the translucent member 43 coated with the resin 8 on trial is fed, and mounted on the translucent member mounting portion 41 having the LED elements 5 as the light source units that emit the excitation light for exciting the phosphor (translucent member mounting step). Then, the resin 8 coated on the translucent member 43 is irradiated with the excitation light emitted from the LED element 5 whereby the light emitted by the resin 8 is received by the spectroscope 42, and the light emitting characteristics) of the received light are measured by the light emitting characteristic measurement unit 39 (light emitting characteristic measuring step) (ST23).

With the above processing, as illustrated in FIG. 15B, the light emitting characteristic measurement value represented by the chromaticity coordinate Z (refer to FIG. 13) is obtained. The measurement results do not always match the light emitting characteristics defined in advance due to an error of the coating amount and a change in the concentration of the phosphor grains in the resin 8 described above, that is, the standard chromaticity coordinates ZA0 to ZE0 at the appropriate resin coating time illustrated in FIG. 12A. For that reason, the coating amount derivation processing unit 38 obtains deviation ($\Delta X_A$, $\Delta Y_A$) to ($\Delta X_E$, $\Delta Y_E$) indicative of a gap in the X- and Y-coordinates between the obtained chromaticity coordinates ZA1 to ZE1, and the standard chromaticity coordinates ZA0 to ZE0 at the appropriate resin coating time illustrated in FIG. 12A. Then, the coating amount derivation processing unit 38 determines whether a correction for obtaining desired light emitting characteristics is necessary, or not.

In this case, it is determined whether the measurement results fall within the threshold value, or not (ST24). That is, as illustrated in FIG. 15C, the coating amount derivation processing unit 38 compares the deviation obtained in (ST23) with the threshold value to determine whether the deviation ($\Delta X_A$, $\Delta Y_A$) to ($\Delta X_E$, $\Delta Y_E$) fall within ±10% of ZA0 to ZE0, or not. In this example, if the deviation falls within the threshold value, the discharge operation parameters corresponding to the preset appropriate resin coating amounts VA0 to VE0 are maintained as they are. On the contrary, if the deviation exceeds the threshold value, the coating amount is corrected (ST25). That is, the coating amount derivation processing unit 38 obtains the deviation between the measurement result in the light emitting characteristic measuring step and the light emitting characteristics defined in advance, and executes processing of deriving new appropriate resin coating amounts (VA2 to VE2) for real production to be coated on the LED element 5 on the basis of the obtained deviation, as illustrated in FIG. 15D (coating amount derivation processing step).

In this example, the appropriate resin coating amounts (VA2 to VE2) that have been corrected are updated values obtained by adding corrects corresponding to the respective deviations of the preset appropriate resin coating amounts VA0 to VE0. A relationship between the deviation and the correction is recorded in the resin coating information 14 as the known associated data in advance. Then, the processing of (ST22), (ST23), (ST24), and (ST25) is iteratively executed on the basis of the corrected appropriate resin coating amounts (VA2 to VE2). It is confirmed in (ST24) that the deviation between the measurement results and the light emitting characteristics defined in advance fall within the threshold value to decide the appropriate resin coating amount for real production. That is, in the above-mentioned resin coating method, the measurement coating step, the translucent member mounting step, the light emitting characteristic measuring step, and the coating amount deriving step are iteratively executed to determinately derive the appropriate resin coating amount. Then, the determined appropriate resin coating amount is recorded in the storage unit 81 as the real production coating amount 81b.

Figure 14:
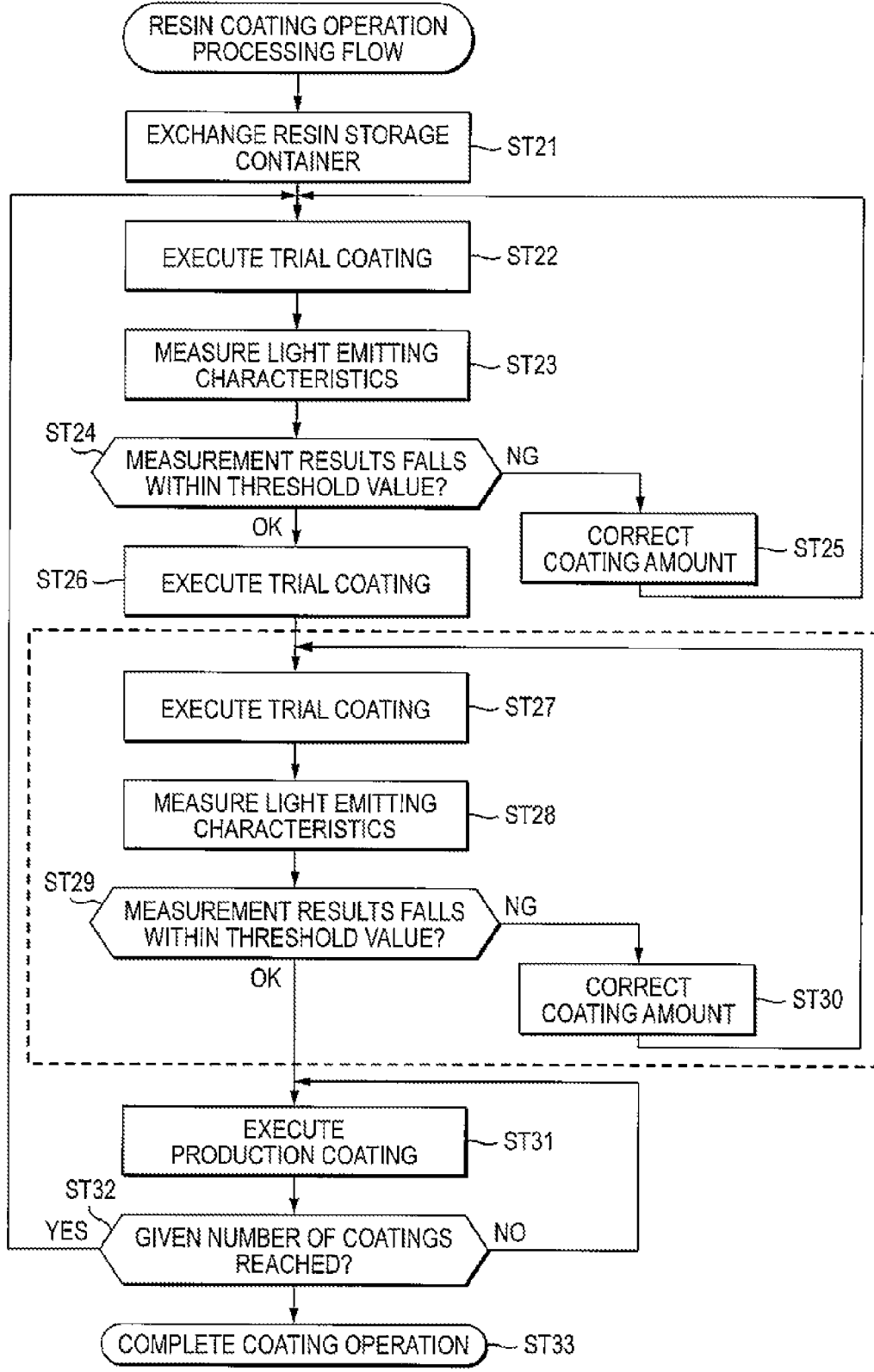
FIG. 14 is a flowchart of resin coating operation processing in an LED package manufacturing process in the LED package manufacturing system according to the embodiment of the present invention.

Thereafter, the flow proceeds to a subsequent step to execute trial coating (ST26). In this situation, a given amount of resin 8 is discharged from the discharge nozzle 33a to improve a resin flow state within the resin discharge path, and stabilize the operation of the dispenser 33 and the resin discharge mechanism 35. The processing of (ST27), (ST28), (ST29), and (ST30) indicated by a dashed frame in FIG. 14 is identical with the processing contents indicated in (ST22), (ST23), (ST24), and (ST25), and executed when there is a need to elaborately confirm that desired light emitting characteristics are completely ensured. This processing is not always an essential execution item.

After the appropriate resin coating amount providing the desired light emitting characteristics is determined in this way, the production coating is executed (ST31). That is, the production execution processing unit 37 instructs the coating control unit 36 that controls the resin discharge mechanism 35 on the appropriate resin coating amount derived by the coating amount derivation processing unit 38 and stored as the real production coating amount 81b, to thereby execute the production coating processing of coating the resin 8 of the appropriate resin coating amount on the LED element 5 mounted on the substrate 4 (production executing step).

Then, in a process of iteratively executing the production coating processing, the number of coating by the dispenser 33 is counted, and it is monitored whether the number of coatings reaches a given number of times, or not (ST32). That is, until the number of coatings reaches the given number of times, it is determined that a change in the property of the resin 8 and the phosphor concentration D1 is small, and the production coating execution (ST31) is iteratively conducted while maintaining the identical real production coating amount 81b. Then, if it is confirmed that the number of coatings reaches the given number of times in (ST32), it is determined that there is a possibility that the property of the resin 8 and the phosphor concentration are changed. The flow returns to (ST22). Subsequently, likewise, the measurement of the light emitting characteristics and the coating amount correction processing based on the measurement result are iteratively executed.

Figure 17C:
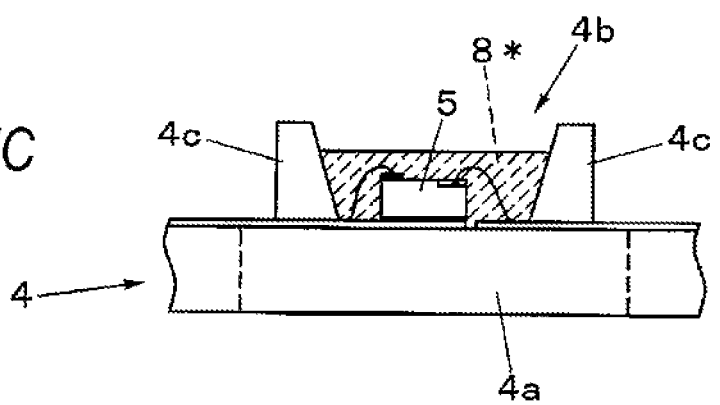
Figure 17D:
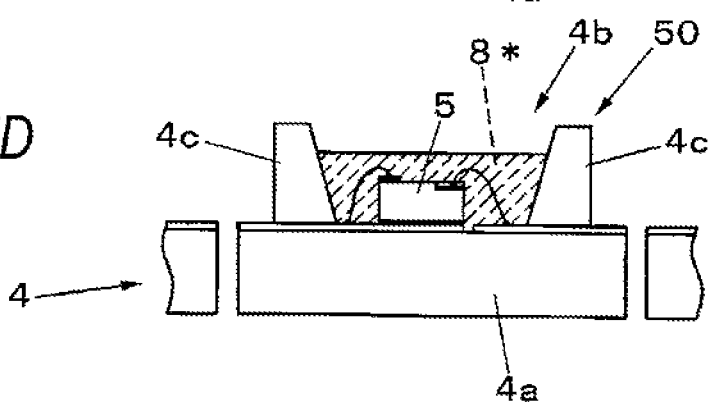

Upon completion of the resin coating for a single substrate 4 in this way, the substrate 4 is transmitted to the curing device M5, and heated by the curing device M5 to cure the resin 8 (ST9). As a result, as illustrated in FIG. 17C, the resin 8 coated over the LED element 5 is thermally cured into the resin 8*, and firmly fixed within the LED mounting portion 4b. Then, the substrate 4 that has been subjected to the resin curing is transmitted to the piece cutting device M6. In the piece cutting device M6, the substrate 4 is cut into each of the piece substrates 4a, and divided into the piece LED packages 50 as illustrated in FIG. 17D (ST10). With the above operation, the LED package 50 is completed.

As described above, the LED package manufacturing system 1 according to the above embodiment includes: the component mounting device M1 that mounts a plurality of LED elements 5 on the substrate 4; the element characteristic information providing unit for providing the information obtained by measuring the light emitting wavelength of the plurality of LED elements 5 in advance, individually, as element characteristic information 12; the resin information providing unit for providing the information associating the appropriate resin coating amount of the resin 8 for obtaining the LED package 50 having the specified light emitting characteristics with the element characteristic information 12, as resin coating information 14; the map data creating unit for creating the map data 18 associating the mounting position information 71a indicative of the positions of the LED elements 5 mounted by the component mounting device M1 on the substrate 4 with the element characteristic information 12 on the LED elements 5 for each substrate 4; and the resin coating device M4 that coats the resin 8 of the appropriate resin coating amount for providing specific light emitting characteristics on the respective LED elements mounted on the substrate 4, on the basis of the map data 18 and the resin coating information 14.

The resin coating device M4 includes: the resin coating portion C that discharges the resin 8 of the variable coating amount to coat the resin 8 at an arbitrary position to be coated; the coating control unit 36 that controls the resin coating portion C to execute the measurement coating processing of coating the resin 8 on the translucent member 43 on trial as the light emitting characteristic measurement, and to execute the production coating processing of coating the resin 8 on the LED elements as the real production; the translucent member mounting unit 41 having the light source unit that emits the excitation light for exciting the phosphor, on which the translucent member 43 coated with the resin 8 on trial in the measurement coating processing is mounted; the light emitting characteristic measurement unit 39 that irradiates the resin 8 coated on the translucent member 43 with the excitation light emitted from the light source unit to measure the light emitting characteristics of the light emitted by the resin 8; the coating amount derivation processing unit 38 that obtains the deviation between the measurement result of the light emitting characteristic measurement unit 39 and the light emitting characteristics specified in advance, and corrects the appropriate resin coating amount on the basis of the deviation to derive the appropriate resin coating amount for the real production to be coated on the LED elements 5; and the production execution processing unit 37 that instructs the coating control unit 36 on the derived appropriate resin coating amount to execute the production coating processing of coating the resin of the appropriate resin coating amount on the LED elements 5.

With the above configuration, in the resin coating used for manufacture of the LED package 50 in which the LED elements 5 are covered with the resin containing the phosphor, the translucent member 43 coated with the resin 8 as the light emitting characteristic measurement is mounted on the translucent member mounting portion 41 having the light source unit, and the resin coated on the translucent member 43 is irradiated with the excitation light emitted from the light source unit to obtain the deviation between the measurement result obtained by measuring the light emitting characteristic of the light emitted from the resin, and the light emitting characteristic specified in advance, and the appropriate resin coating amount of the resin to be coated on the LED element as the real production can be derived on the basis of this deviation. As a result, even if the light emitting wavelengths of the piece LED elements 5 are varied, the even light emitting characteristics of the LED package 50 can be achieved to improve the production yield.

Also, in the LED package manufacturing system 1 configured as described above, the respective devices of the management computer 3 and the component mounting device M1 to the piece cutting device M6 are connected to each other by the LAN system 2. However, the LAN system 2 is not always essentially required in configuration. That is, there is the storage unit that is prepared in advance and stores the element characteristic information 12 and the resin coating information 14, which are transmitted from the external, for each of the LED packages 50. If there is data providing unit that can provide the element characteristic information 12 to the component mounting device M1, and the resin coating information 14 and the map data 18 to the resin coating device M4, from the storage unit, any time as occasion demands, the function of the LED package manufacturing system 1 according to this embodiment can be realized.

The present invention is not limited to the above embodiments, but modifications and applications by an ordinary skilled person on the basis of the disclosure of the present specification and known techniques are intended by the present invention without departing from the spirit and the scope of the present invention, and included in a scope to be protected. Also, the respective components in the above embodiments may be arbitrarily combined together without departing from the subject matter of the present invention.

The present invention is based on Japanese Patent Application No. 2010-240468 filed on Oct. 27, 2010, and content thereof is incorporated herein by reference.

INDUSTRIAL APPLICABILITY

The LED package manufacturing system and the resin coating method according to the present invention have such advantages which can achieve the even light emitting characteristics of the LED package to improve the production yield even if the light emitting wavelengths of the pieces of LED elements are varied, and is available in the field of manufacturing the LED package with the configuration in which the LED element is covered with the resin containing the phosphor.

LIST OF REFERENCE SIGNS

1, LED package manufacturing system
2, LAN system
4, substrate
4a, piece substrate
4b, LED mounting portion
4c, reflector portion
5, LED element
8, resin
12, element characteristic information
13A, 13B, 13C, 13D, 13E, LED sheet
14, resin coating information
18, map data
23, resin adhesive
24, adhesive transfer mechanism
25, component supply mechanism
26, component mounting mechanism
32, resin discharge head
33, dispenser
33a, discharge nozzle
40, trial coating and measurement unit
41, translucent member mounting portion
42, spectroscope
43, translucent member
45, trial coating stage
50, LED package

The invention claimed is:

1. An LED package manufacturing system that manufactures an LED package in which an LED element mounted on a substrate is covered with a resin containing a phosphor therein, the LED package manufacturing system comprising:
a component mounting device that mounts a plurality of LED elements on the substrate;
an element characteristic information providing unit providing information obtained by measuring light emitting characteristics of the plurality of LED elements including a light emitting wavelength in advance, individually, as element characteristic information;
a resin information providing unit providing information associating an appropriate resin coating amount of the resin for obtaining the LED package having specified light emitting characteristics with the element characteristic information, as resin coating information;
a map data creating unit creating map data associating mounting position information indicative of positions of the LED elements mounted by the component mounting device on the substrate with the element characteristic information on the LED elements for each substrate; and
a resin coating device that coats the resin of the appropriate resin coating amount for providing specific light emitting characteristics on the respective LED elements mounted on the substrate, on the basis of the map data and the resin coating information,
wherein the resin coating device comprises:
a resin coating unit that discharges the resin of a variable coating amount to coat the resin at an arbitrary position to be coated;
a coating control unit that controls the resin coating unit to execute measurement coating processing of coating the resin on a translucent member on trial as light emitting characteristic measurement, and to execute production coating processing of coating the resin on the LED elements as real production;
a translucent member mounting unit having a light source unit that emits an excitation light for exciting the phosphor, on which the translucent member coated with the resin on trial in the measurement coating processing is mounted;
a light emitting characteristic measurement unit that irradiates the resin coated on the translucent member with the excitation light emitted from the light source unit to measure the light emitting characteristics of the light emitted by the resin;

a coating amount derivation processing unit that obtains a deviation between a measurement result of the light emitting characteristic measurement unit and the light emitting characteristics specified in advance, and corrects the appropriate resin coating amount on the basis of the deviation to derive an appropriate resin coating amount for the real production to be coated on the LED elements; and a production execution processing unit that instructs the coating control unit on the derived appropriate resin coating amount to execute the production coating processing of coating the resin of the appropriate resin coating amount on the LED elements.

2. The LED package manufacturing system according to claim 1, wherein each of the component mounting device and the resin coating device is connected to a LAN system, and the element characteristic information providing unit and the resin information providing unit transmit the element characteristic information and the resin coating information which are read from external storage unit to the component mounting device and the resin coating device through the LAN system, respectively.

3. The LED package manufacturing system according to claim 1, wherein the map data creating unit is disposed in the component mounting device, and the map data is transmitted to the resin coating device from the component mounting device.

4. A resin coating method in an LED package manufacturing system that manufactures an LED package in which an LED element mounted on a substrate is covered with a resin containing a phosphor therein, in which the resin is coated on a plurality of LED elements mounted on the substrate by the component mounting device, the LED package manufacturing system including: a component mounting device that mounts the plurality of LED elements on the substrate; an element characteristic information providing unit providing information obtained by measuring light emitting characteristics of the plurality of LED elements including a light emitting wavelength in advance, individually, as element characteristic information; a resin information providing unit providing information associating an appropriate resin coating amount of the resin for obtaining the LED package having specified light emitting characteristics with the element characteristic information, as resin coating information; a map data creating unit creating map data associating mounting position information indicative of positions of the LED elements mounted by the component mounting device on the substrate with the element characteristic information on the LED elements for each substrate; and a resin coating device that coats the resin of the appropriate resin coating amount for providing regular light emitting characteristics required for a completed product on the respective LED elements mounted on the substrate, on the basis of the map data and the resin coating information, the resin coating method comprising:

a measurement coating step of coating the resin on a translucent member as light emitting characteristic measurement on trial by a resin discharge unit that discharges the resin of a variable coating amount;

a translucent member mounting step, performed after the measurement coating step, of mounting the translucent member coated with the resin on trial on a translucent member mounting unit having a light source unit which emits an excitation light for exciting the phosphor;

a light emitting characteristic measuring step, performed after the translucent member mounting step, of irradiating the resin coated on the translucent member with the excitation light emitted from the light source unit to measure the light emitting characteristics of the light emitted by the resin;

a coating amount derivation processing step, performed after the light emitting characteristic measuring step, of obtaining a deviation between a measurement result in the light emitting characteristic measurement step and the light emitting characteristic specified in advance, and correcting the appropriate resin coating amount on the basis of the deviation to derive an appropriate resin coating amount for real production to be coated on the LED elements; and a production executing step, performed after the coating amount derivation processing step, of instructing a coating control unit that controls the resin discharge unit on the derived appropriate resin coating amount to execute the production coating processing of coating the resin of the appropriate resin coating amount on the LED elements.

5. The resin coating method in the LED package manufacturing system according to claim 4, wherein the LED elements are used as the light source unit, and the light emitting characteristics specified in advance are light emitting characteristics in which the regular light emitting characteristics obtained for the completed product in which the resin coated on the LED elements is cured is slanted by a difference of the light emitting characteristics caused by an uncured state of the resin.

6. The resin coating method in the LED package manufacturing system according to claim 4, wherein the measurement coating step, the translucent member mounting step, the light emitting characteristic measuring step, and the coating amount deriving step are iteratively executed to determinately derive the appropriate resin coating amount.

* * * * *